US 8,872,273 B2

(12) United States Patent
Kawahara et al.

(10) Patent No.: US 8,872,273 B2
(45) Date of Patent: Oct. 28, 2014

(54) INTEGRATED GATE CONTROLLED HIGH VOLTAGE DIVIDER

(75) Inventors: Hideaki Kawahara, Tokyo (JP); Marie Denison, Plano, TX (US); Sameer Pendharkar, Allen, TX (US); Philip L. Hower, Concord, MA (US); John Lin, Chelmsford, MA (US); Robert A. Neidorff, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/567,340

(22) Filed: Aug. 6, 2012

(65) Prior Publication Data

US 2013/0032863 A1 Feb. 7, 2013

Related U.S. Application Data

(60) Provisional application No. 61/515,158, filed on Aug. 4, 2011.

(51) Int. Cl.
*H01L 27/11* (2006.01)
*H01L 27/06* (2006.01)
*H01L 49/02* (2006.01)

(52) U.S. Cl.
CPC ............ *H01L 28/20* (2013.01); *H01L 27/0629* (2013.01)
USPC ........... 257/379; 257/360; 257/380; 257/489; 257/492; 257/536; 257/E29.012; 438/190; 438/238; 438/329; 438/330

(58) Field of Classification Search
USPC ......... 257/350, 359, 360, 363, 379, 380, 489, 257/492, 493, 536, 537, 538, 904, E29.012, 257/E29.256
See application file for complete search history.

(56) References Cited

U.S. PATENT DOCUMENTS

| | | | | |
|---|---|---|---|---|
| 4,947,192 A | * | 8/1990 | Hawkins et al. | ................. 347/59 |
| 2012/0091529 A1 | | 4/2012 | Cheng et al. | |
| 2013/0032862 A1 | * | 2/2013 | Su et al. | ......................... 257/272 |

* cited by examiner

*Primary Examiner* — Benjamin Sandvik
*Assistant Examiner* — Leslie Pilar Cruz
(74) *Attorney, Agent, or Firm* — Jacqueline J. Garner; Frederick J. Telecky, Jr.

(57) ABSTRACT

An integrated circuit containing a gate controlled voltage divider having an upper resistor on field oxide in series with a transistor switch in series with a lower resistor. A resistor drift layer is disposed under the upper resistor, and the transistor switch includes a switch drift layer adjacent to the resistor drift layer, separated by a region which prevents breakdown between the drift layers. The switch drift layer provides an extended drain or collector for the transistor switch. A sense terminal of the voltage divider is coupled to a source or emitter node of the transistor and to the lower resistor. An input terminal is coupled to the upper resistor and the resistor drift layer. A process of forming the integrated circuit containing the gate controlled voltage divider.

21 Claims, 14 Drawing Sheets

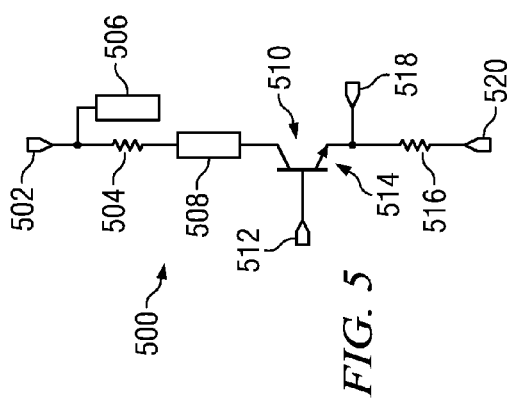
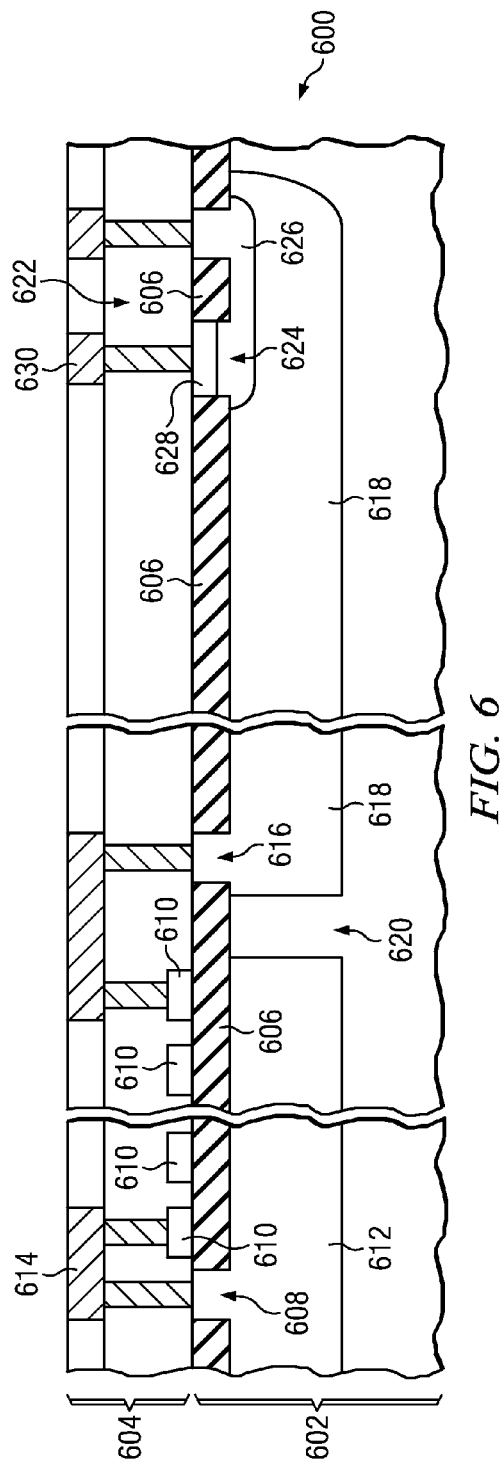

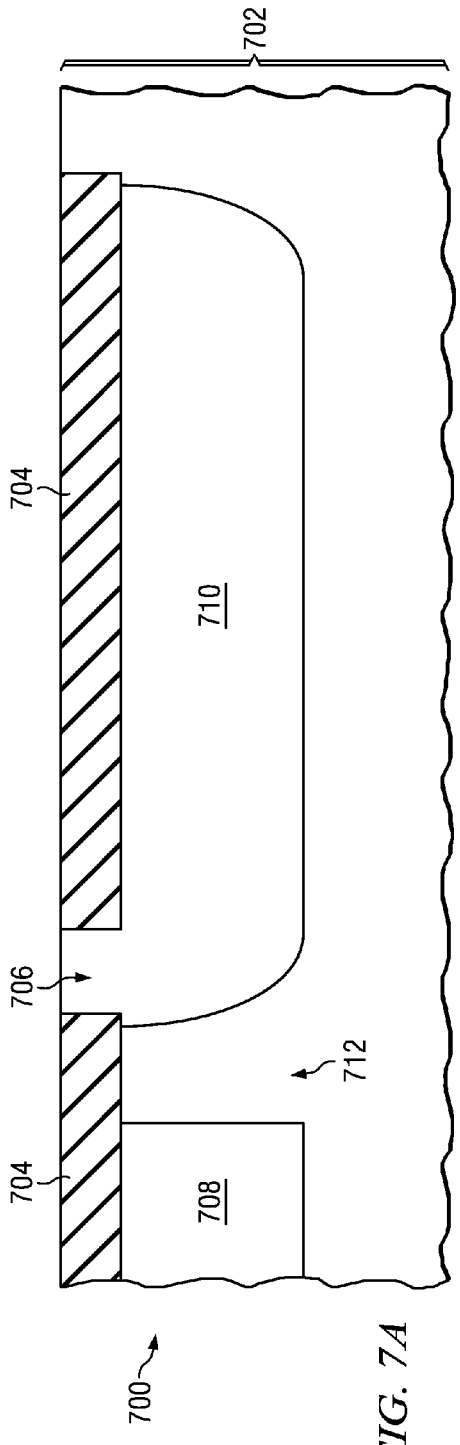
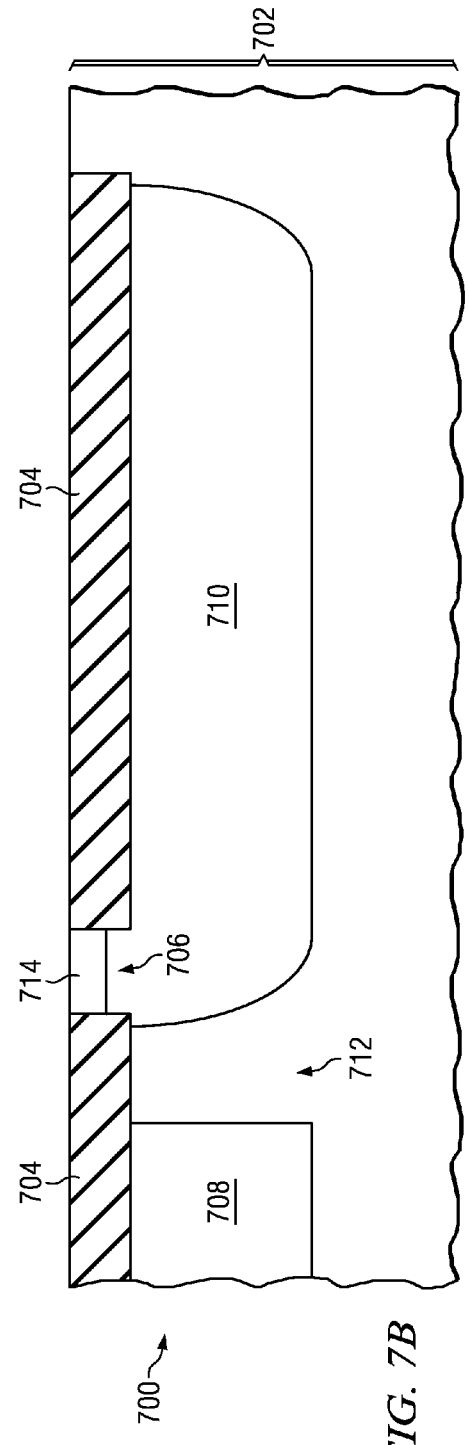
FIG. 7A
FIG. 7B

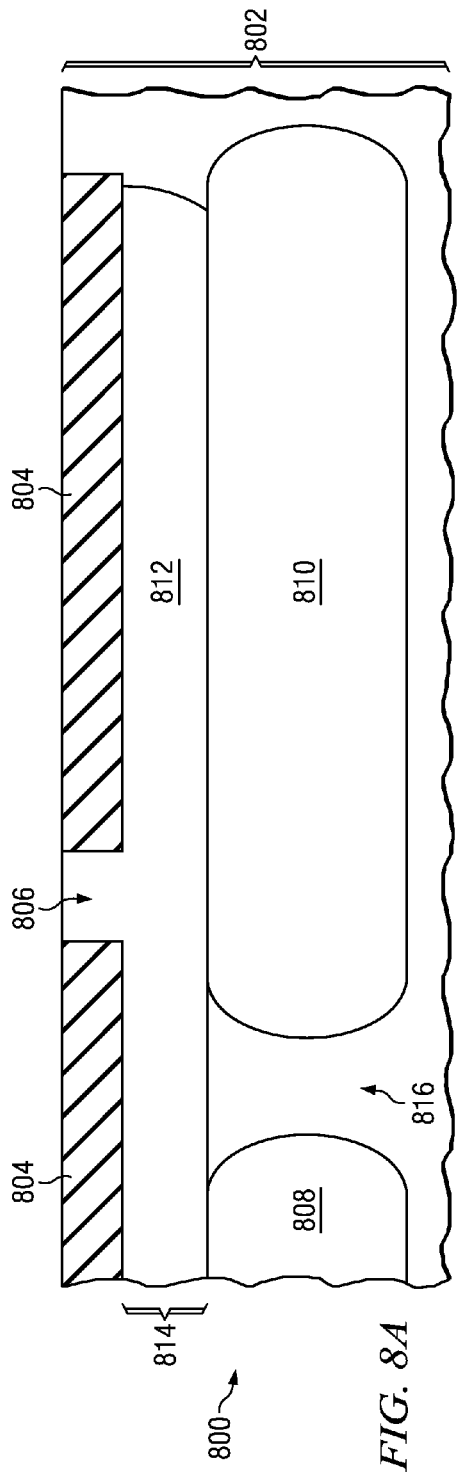
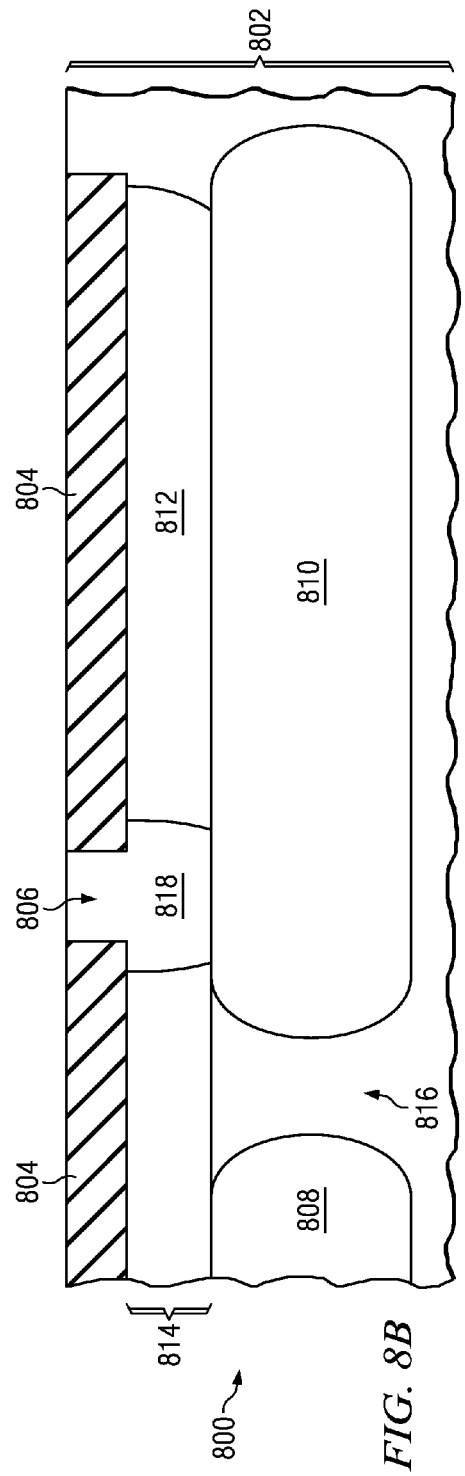
FIG. 8A
FIG. 8B

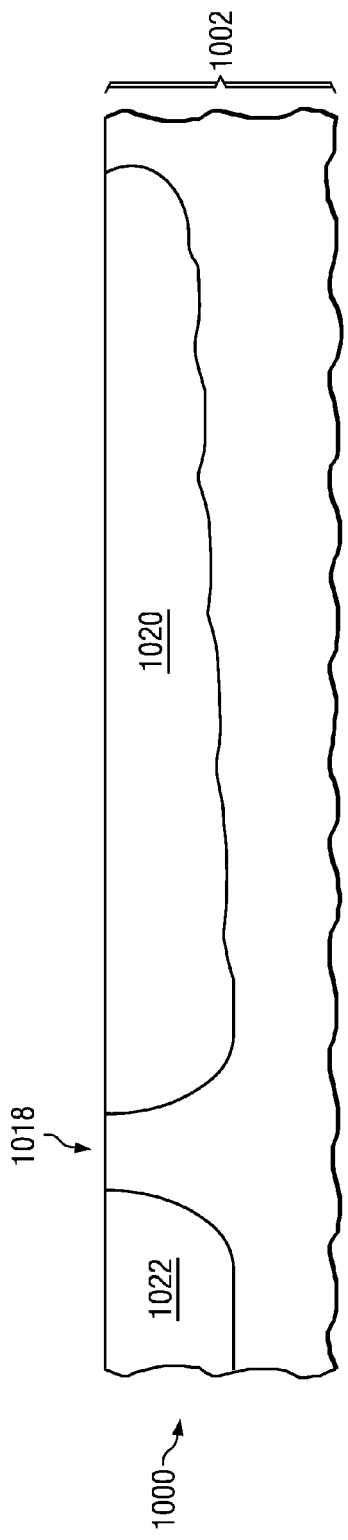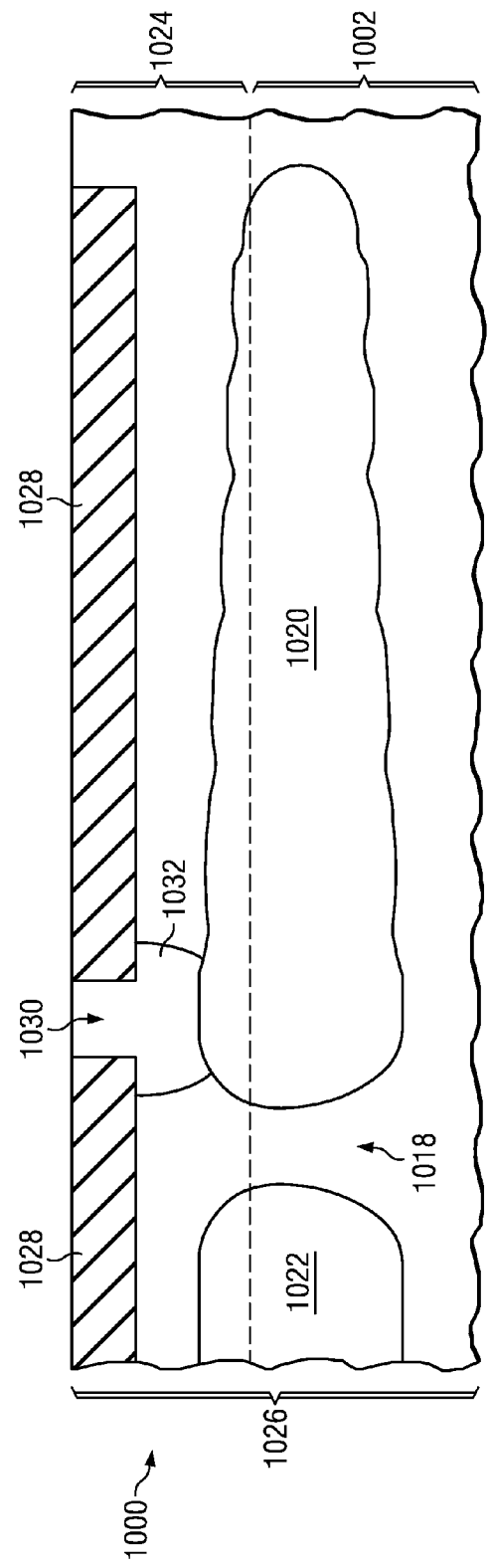

INTEGRATED GATE CONTROLLED HIGH VOLTAGE DIVIDER

CROSS-REFERENCE TO RELATED APPLICATIONS

The following co-pending patent application is related and hereby incorporated by reference: U.S. patent application Ser. No. 13/567,456, filed Aug. 6, 2010, filed simultaneously with this application).

FIELD OF THE INVENTION

This invention relates to the field of integrated circuits. More particularly, this invention relates to voltage dividers in integrated circuits.

BACKGROUND OF THE INVENTION

An integrated circuit may contain a gate controlled voltage divider which has an upper resistor connected through a transistor switch in series with a lower resistor. A sense terminal is provided at the node between the switch and the lower resistor. An input voltage is applied to an input terminal on the upper resistor opposite from the switch. A reference voltage is applied to a reference terminal on the lower resistor opposite from the switch. It may be desirable to apply an input voltage higher than a breakdown voltage of dielectric materials in the integrated circuit adjacent to the upper resistor, while providing a sense voltage at the sense terminal close to an operating voltage of circuits in the integrated circuit. It may further be desirable to electrically isolate the input terminal from the sense terminal on occasion, for example to reduce power consumption.

SUMMARY OF THE INVENTION

An integrated circuit may be formed to contain a gate controlled voltage divider having an upper resistor disposed on field oxide over a resistor drift layer in the substrate of the integrated circuit. The gate controlled voltage divider also includes a transistor switch. The switch includes a switch drift layer in the substrate. The upper resistor is coupled to the switch drift layer. The gate controlled voltage divider contains a lower resistor which is electrically coupled to the switch at a sense terminal. The upper resistor, the resistor drift layer, and the switch drift layer are configured so as to provide an electric field in the field oxide and the substrate below breakdown conditions.

DESCRIPTION OF THE VIEWS OF THE DRAWING

FIG. 1, FIG. 3 and FIG. 5 are schematic diagrams of gate controlled voltage dividers according to embodiments of the invention.

FIG. 6 is a cross section of an integrated circuit containing a gate controlled voltage divider with a bipolar transistor switch as depicted in FIG. 5.

FIG. 7A and FIG. 7B are cross sections of an integrated circuit containing a gate controlled voltage divider formed according to an embodiment, depicted in successive stages of fabrication of a switch drift layer of the gate controlled voltage divider.

FIG. 8A through FIG. 8C are cross sections of an integrated circuit containing a gate controlled voltage divider formed according to another embodiment, depicted in successive stages of fabrication of a switch drift layer of the gate controlled voltage divider.

FIG. 10A through FIG. 10C are cross sections of an integrated circuit having a gate controlled voltage divider with a drift layer formed according to an embodiment, depicted in successive stages of fabrication of a switch drift layer of the gate controlled voltage divider.

DETAILED DESCRIPTION OF EXAMPLE EMBODIMENTS

Figure 1:
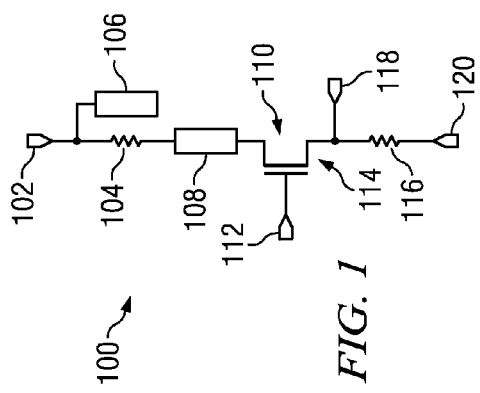

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be formed to contain a gate controlled voltage divider having an upper resistor disposed on field oxide over a resistor drift layer in the substrate of the integrated circuit. The gate controlled voltage divider also includes a transistor switch. The switch includes a switch drift layer in the substrate. The upper resistor is coupled to the switch drift layer. The gate controlled voltage divider contains a lower resistor which is electrically coupled to the switch at a sense terminal. The upper resistor, the resistor drift layer, and the switch drift layer are configured so as to provide an electric field in the field oxide and the substrate below breakdown conditions. A lower resistor is formed in series with the switch, and a sense terminal is formed which electrically couples to a sense terminal on the lower resistor at a connection the switch. A reference terminal is formed which is electrically coupled to a reference node on the lower resistor opposite from the switch.

For the purposes of this description, the term "RESURF" will be understood to refer to a material which reduces an electric field in an adjacent semiconductor region. A RESURF region may be for example a semiconductor region with an opposite conductivity type from the adjacent semiconductor region. RESURF structures are described in Appels, et.al., "Thin Layer High Voltage Devices" Philips J, Res. 35 1-13, 1980.

For the purposes of this description, the term "Vdd" is understood to refer to a power supply node with a potential suitable for source nodes of p-channel metal oxide semiconductor (PMOS) transistors. Similarly, the term "Vss" is understood to refer to a power supply node with a potential suitable for source nodes of n-channel metal oxide semiconductor (NMOS) transistors, and is lower than the Vdd potential.

FIG. 1 is a schematic diagram of a gate controlled voltage divider according to an embodiment. The voltage divider 100 includes an input terminal 102 connected to an upper resistor 104 and to a resistor drift layer 106 under the upper resistor 104. The upper resistor 104 is connected in series to a lower resistor 116 through a switch 110, which in the instant example is a MOS transistor switch 110. In other examples, the switch 110 may be other devices, such as a junction field effect transistor (JFET) or a bipolar transistor as discussed in reference to FIG. 3 and FIG. 5. The upper resistor 104 is connected to a switch drift layer 108 which is part of an extended drain of the MOS transistor switch 110. The MOS transistor switch 110 includes a gate node 112 and a source node 114. A lower resistor 116 is coupled to the source node 114. A sense terminal 118 is connected to the source node 114 and to the lower resistor 116. A reference node 120 is connected to the lower resistor 116 opposite from the sense terminal 118. Values of the upper resistor 104 and lower resistor 116 may be selected so that a maximum desired input voltage may be applied to the input terminal 102 and a reference voltage between Vdd and Vss may be applied to the reference node 120 so as to provide a voltage at the sense terminal 118 within a safe operating voltage of transistors in the integrated circuit containing the voltage divider 100.

Figure 2:
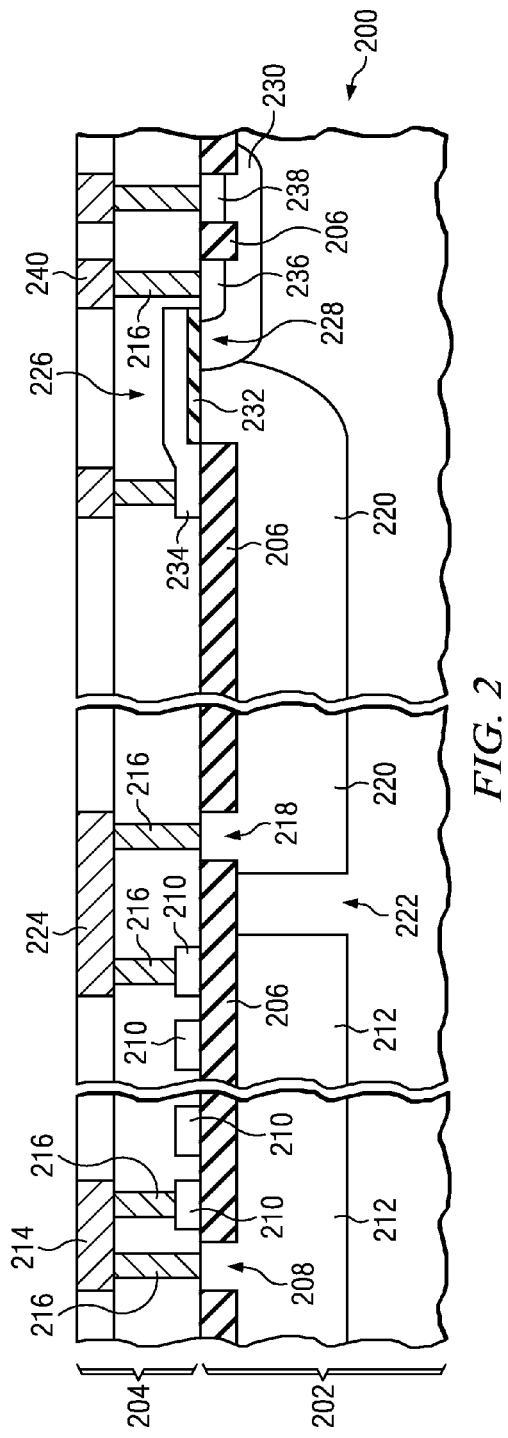
FIG. 2 is a cross section of an integrated circuit containing a gate controlled voltage divider with an MOS transistor switch as depicted in FIG. 1.

FIG. 2 is a cross section of an integrated circuit containing a gate controlled voltage divider with an MOS transistor switch as described in reference to FIG. 1. The integrated circuit 200 is formed in and on a semiconductor substrate 202 with an interconnect region 204 above the substrate 202. Field oxide 206 is formed at a top surface of the substrate 202 with a central opening 208 which exposes the substrate 202 at a high voltage input of the voltage divider. The integrated circuit 200 includes an upper resistor 210 of the voltage divider formed over the field oxide 206 and a resistor drift layer 212 of an opposite conductivity type from the substrate 202 formed in the substrate 202 under the upper resistor 210, for example as described in U.S. patent application 13/567,456 cited above. An input terminal 214 is electrically coupled to the resistor drift layer 212 at the central opening 208 and to the upper resistor 210 at a point adjacent to the central opening 208, for example, through contacts 216. The upper resistor 210 may, for example be a spiral resistor encircling the central opening 208 where the upper resistor is connected to the input terminal 214 at one end of the spiral nearest the central opening. Other resistor configurations may alternatively be used.

The field oxide 206 also includes a switch connection opening 218 which exposes the substrate 202 at an opposite end of the upper resistor 210 from the central opening 208. A switch drift layer 220 of the opposite conductivity type from the substrate 202 is formed in the substrate 202 under the field oxide 206 adjacent to, and outward from, the resistor drift layer 212. The switch drift layer 220 is laterally separated from the resistor drift layer 212 by a drift layer separation region 222 which includes semiconductor material of a same conductivity type as the substrate 202. Embodiments of the drift layer separation region 222 will be described herein. The upper resistor 210 is electrically coupled to the switch drift layer 220 at the switch connection opening 218, for example, through contacts 216 and a metal interconnect line 224. In the example that the upper resistor 210 is a spiral resistor encircling the central opening 208, the switch drift layer 220 is electrically coupled to the outermost end of the spiral resistor (opposite end from that connected to the input terminal).

A switch 226 which is an extended drain MOS transistor is formed at an outer edge of the field oxide 206 so that the switch drift layer 220 is part of an extended drain of the MOS transistor 226. The MOS transistor switch 226 includes a channel region 228 of the same conductivity type as the substrate 202, possibly contained in a body well 230 of the same conductivity type as the substrate 202. The MOS transistor switch 226 also includes a gate dielectric layer 232 formed on the top surface of the substrate 202 over the channel region 228 and the switch drift layer 220, and a gate 234 formed over the gate dielectric layer 232 and possibly extending over the field oxide 206 over the switch drift layer 220. The MOS transistor switch 226 further includes a source layer 236 of the opposite conductivity type from the substrate 202 formed in the substrate 202 adjacent to the gate 234 opposite from the switch drift layer 220. A body contact layer 238 of the same conductivity type as the substrate 202 may be formed proximate to the channel region 228, for example in the body well 230 if present. A lower resistor, not shown, of the voltage divider is electrically coupled to the source layer 236 through a sense terminal 240, for example through contacts 216.

During operation of the integrated circuit 200, an input voltage may be applied to the input terminal 214. A gate bias voltage may be applied to the gate 234 so as to modulate current through the upper resistor 210. For example, if the gate 234 is biased so as to turn off the MOS transistor switch 226, current through the upper resistor 210 may be reduced to leakage current from the switch drift layer 220 to the substrate 202. If the gate 234 is biased so as to turn on the MOS transistor switch 226, current through the upper resistor 210 may flow through the lower resistor, allowing a measurement of a sense voltage at the sense terminal 240 which is a function of the input voltage.

Figure 3:
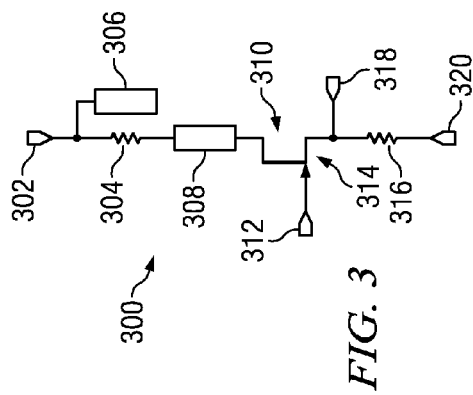

FIG. 3 is a schematic diagram of a gate controlled voltage divider according to an embodiment. The voltage divider 300 includes an input terminal 302 connected to an upper resistor 304 and to a resistor drift layer 306 under the upper resistor 304. The upper resistor 304 is connected in series to a lower resistor 316 through a switch 310, which in the instant example is a JFET switch 310. The upper resistor is connected to a switch drift layer 308 which is part of an extended drain of a JFET switch 310. The JFET switch 310 includes a gate node 312 and a source node 314. A lower resistor 316 is coupled to the source node 314. A sense terminal 318 is connected to the source node 314 and to the lower resistor 316. A reference node 320 is connected to the lower resistor 316 opposite from the sense terminal 318. Values of the upper resistor 304 and lower resistor 316 may be selected so as to provide a voltage at the sense terminal 318 within a safe operating voltage of transistors in the integrated circuit containing the voltage divider 300.

Figure 4:
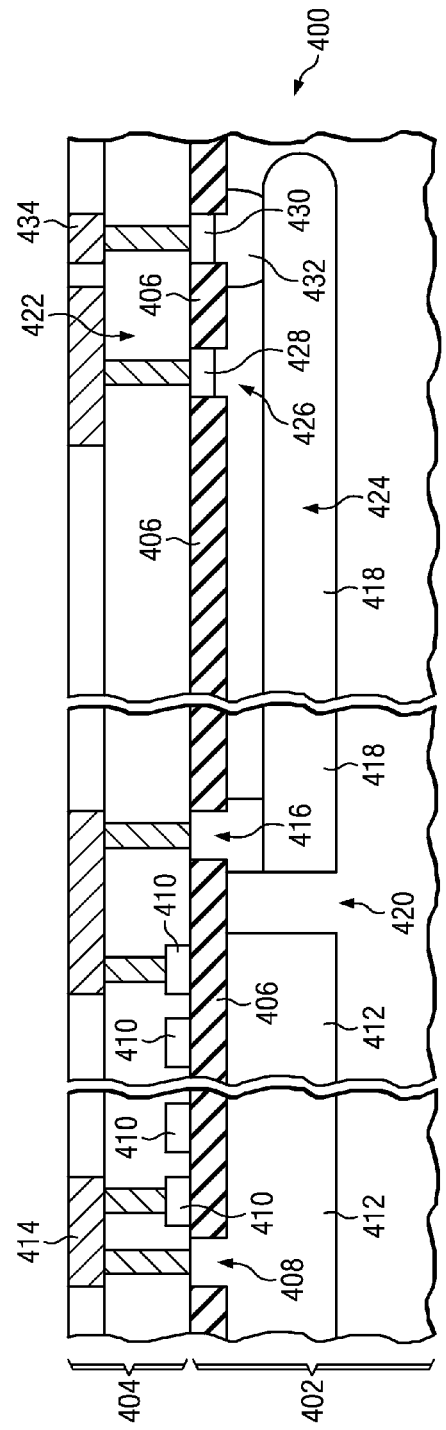
FIG. 4 is a cross section of an integrated circuit containing a gate controlled voltage divider with a JFET switch as depicted in FIG. 3.

FIG. 4 is a cross section of an integrated circuit containing a gate controlled voltage divider with a JFET switch as described in reference to FIG. 3. The integrated circuit 400 is formed in and on a semiconductor substrate 402 with an interconnect region 404 above the substrate 402. Field oxide 406 with a central opening 408, an upper resistor 410, a resistor drift layer 412 and an input terminal 414 are formed as described in reference to FIG. 2. The field oxide 406 also includes a switch connection opening 416 which exposes the substrate 402 at an opposite end of the upper resistor 410 from the central opening 408. A buried switch drift layer 418 of the opposite conductivity type from the substrate 402 is formed in the substrate 402 under the field oxide 406 adjacent to, and outward from, the resistor drift layer 412. The switch drift layer 418 is laterally separated from the resistor drift layer 412 by a drift layer separation region 420 as described in reference to FIG. 2. The upper resistor 410 is electrically coupled to the switch drift layer 418 at the switch connection opening 416.

A switch 422 which is an extended drain JFET is formed at an outer edge of the field oxide 406 so that the switch drift layer 418 is part of an extended drain of the JFET 422. The JFET switch 422 includes a channel region 424 of an opposite conductivity type from the substrate 402 which is an extension of, or in contact with, the switch drift layer 418. The JFET switch 422 also includes a gate region 426 of the same conductivity type as the substrate 402 abutting the channel region 424, and possibly a gate contact region 428 providing an electrical connection between the gate region 426 and a top surface of the substrate 402. The JFET switch 422 further includes a source layer 430 of the opposite conductivity type from the substrate 402 formed in the substrate 402 adjacent to the gate contact region 428. The source layer 430 may be electrically coupled to the channel region 424 by a source well 432. A lower resistor, not shown, of the voltage divider is electrically coupled to the source layer 430 through a sense terminal 434.

During operation of the integrated circuit 400, an input voltage may be applied to the input terminal 414. A gate bias voltage may be applied to the gate region 426 so as to modulate current through the upper resistor 410. For example, if the gate region 426 is biased so as to turn off the JFET switch 422, current through the upper resistor 410 may be reduced to leakage current from the switch drift layer 418 to the substrate 402. If the gate region 426 is biased so as to turn on the JFET switch 422, current through the upper resistor 410 may flow through the lower resistor, allowing a measurement of a sense voltage at the sense terminal 434 which is a function of the input voltage.

FIG. 5 is a schematic diagram of a gate controlled voltage divider according to an embodiment. The voltage divider 500 includes an input terminal 502 connected to an upper resistor 504 and to a resistor drift layer 506 under the upper resistor 504. The upper resistor 504 is connected in series to a lower resistor 516 through a switch 510, which in the instant example is a bipolar transistor switch 510. The upper resistor is connected to a switch drift layer 508 which is part of an extended collector of a bipolar transistor switch 510. The bipolar transistor switch 510 includes a base node 512 and an emitter node 514. A lower resistor 516 is coupled to the emitter node 514. A sense terminal 518 is connected to the emitter node 514 and to the lower resistor 516. A reference node 520 is connected to the lower resistor 516 opposite from the sense terminal 518. Values of the upper resistor 504 and lower resistor 516 may be selected so as to provide a voltage at the sense terminal 518 within a safe operating voltage of transistors in the integrated circuit containing the voltage divider 500.

FIG. 6 is a cross section of an integrated circuit containing a gate controlled voltage divider with a bipolar transistor switch as described in reference to FIG. 5. The integrated circuit 600 is formed in and on a semiconductor substrate 602 with an interconnect region 404 above the substrate 402. Field oxide 604 with a central opening 606, an upper resistor 608, a resistor drift layer 610 and an input terminal 612 are formed as described in reference to FIG. 2. The field oxide 604 also includes a switch connection opening 614 which exposes the substrate 602 at an opposite end of the upper resistor 608 from the central opening 606. A switch drift layer 616 of the opposite conductivity type from the substrate 602 is formed in the substrate 602 under the field oxide 604 adjacent to, and outward from, the resistor drift layer 610. The switch drift layer 616 is laterally separated from the resistor drift layer 610 by a drift layer separation region 618 as described in reference to FIG. 2. The upper resistor 608 is electrically coupled to the switch drift layer 616 at the switch connection opening 614.

A switch 620 which is a bipolar transistor is formed at an outer edge of the field oxide 604 so that the switch drift layer 616 is part of an extended collector of the bipolar transistor 620. The bipolar transistor switch 620 includes a base region 622 of a same conductivity type as the substrate 602 which may be part of a base well 624. The bipolar transistor switch 620 also includes an emitter region 626 of the opposite conductivity type from the substrate 602 abutting the base region 622. A lower resistor, not shown, of the voltage divider is electrically coupled to the emitter region 626 through a sense terminal 628.

During operation of the integrated circuit 600, an input voltage may be applied to the input terminal 612. A base bias current may be applied to the base region 622 so as to modulate current through the upper resistor 608. For example, if the base region 622 is biased so as to turn off the bipolar transistor switch 620, current through the upper resistor 608 may be reduced to leakage current from the switch drift layer 616 to the substrate 602. If the base region 622 is biased so as to turn on the bipolar transistor switch 620, current through the upper resistor 608 may flow through the lower resistor, allowing a measurement of a sense voltage at the sense terminal 628 which is a function of the input voltage.

FIG. 7A and FIG. 7B are cross sections of an integrated circuit containing a gate controlled voltage divider formed according to an embodiment, depicted in successive stages of fabrication of a switch drift layer of the voltage divider. Referring to FIG. 7A, the integrated circuit 700 is formed in and on a semiconductor substrate 702 which may be a single crystal silicon wafer, a silicon-on-insulator (SOI) wafer, a hybrid orientation technology (HOT) wafer with regions of different crystal orientations, or other material appropriate for fabrication of the integrated circuit 700. In versions of the instant embodiment discussed herein, the substrate 702 is p-type. It will be recognized that a voltage divider may be formed in an integrated circuit having an n-type substrate by an appropriate change in polarities or conductivity types and implanted dopants. Field oxide 704 is formed at a top surface of the substrate 702 in an area defined for an upper resistor of the voltage divider. The field oxide 704 may be, for example, silicon dioxide between 250 and 600 nanometers thick, formed by shallow trench isolation (STI) or local oxidation of silicon (LOCOS) processes. In STI processes, silicon dioxide may be deposited by high density plasma (HDP) or high aspect ratio process (HARP). The field oxide 704 has a switch connection opening 706, for example as described in any of the embodiments discussed in reference to FIG. 2, FIG. 4 and FIG. 6, which exposes the substrate 702. An n-type resistor drift layer 708 is formed in the substrate 702 under the field oxide 704 proximate to, but not directly under, the switch connection opening 706.

An n-type switch drift layer 710 is formed in the substrate 702 under the field oxide 704 and the switch connection opening 706. The switch drift layer 710 is laterally separated from the resistor drift layer 708 by a drift layer separation region 712. In one version of the instant embodiment, the resistor drift layer 708 and the switch drift layer 710 may be formed concurrently.

In the instant embodiment, the switch drift layer 710 contacts a bottom surface of the field oxide 704. The switch drift layer 710 may be formed, for example, by ion implanting n-type dopants such as phosphorus at a dose between $3 \times 10^{11}$ atoms/cm$^2$ and $3 \times 10^{12}$ atoms/cm$^2$, followed by an anneal operation which heats the substrate 702 above 1000° C. in an anneal furnace so as to activate the n-type dopants. A depth of the switch drift layer 710 may be between 1 and 3 microns. In one version of the instant embodiment, the switch drift layer 710 may extend to the top surface of the substrate 702 in the switch connection opening 706 as depicted in FIG. 7A. In another version, the switch drift layer 710 may not necessarily extend to the top surface of the substrate 702. In some versions of the instant embodiment, the switch drift layer 710 may extend past the outer edge of the field oxide 704.

Referring to FIG. 7B, an n-type switch drift layer contact region 714 is formed in the switch connection opening 706 having an average doping density at least twice an average doping density in the switch drift layer 710. The switch drift layer contact region 714 contacts the switch drift layer 710 to provide an electrical connection from the top surface of the substrate 702 in the switch connection opening 706 to the switch drift layer 710. The switch drift layer contact region 714 may be formed, for example, by ion implanting n-type dopants such as phosphorus and arsenic, and possible antimony, into the substrate 702 in the switch connection opening 706, followed by an anneal operation which heats the substrate 702 above 1050° C. in a rapid thermal processing tool. In one version of the instant embodiment, the switch drift layer contact region 714 may be formed concurrently with source and drain layers of NMOS transistors, not shown, in the integrated circuit 700.

After formation of the switch drift layer contact region 714, metal silicide layers, not shown, may be formed on exposed areas of the substrate 702 including the switch connection opening 706 and gates of NMOS and/or PMOS transistors, not shown. The metal silicide layers may be formed by depositing a layer of metal, such as titanium, cobalt or nickel, on a top surface of the integrated circuit 700, heating the integrated circuit 700 to react a portion of the metal with exposed silicon in active areas of the integrated circuit 700, and selectively removing unreacted metal from the integrated circuit 700 surface, commonly by exposing the integrated circuit 700 to wet etchants including a mixture of an acid and hydrogen peroxide.

Figure 8C:
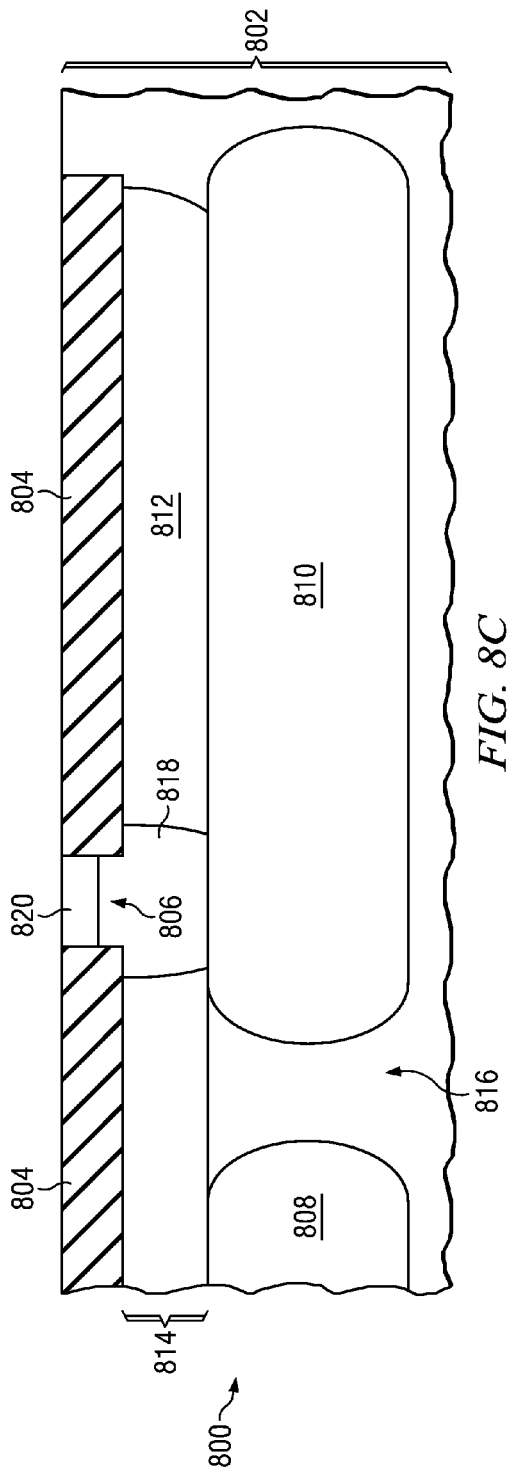

FIG. 8A through FIG. 8C are cross sections of an integrated circuit containing a gate controlled voltage divider formed according to another embodiment, depicted in successive stages of fabrication of a switch drift layer of the voltage divider. Referring to FIG. 8A, the integrated circuit 800 is formed in and on a p-type semiconductor substrate 802 as described in reference to FIG. 7A. Field oxide 804 is formed at a top surface of the substrate 802 with a switch connection opening 806 as described in reference to FIG. 7A. An n-type resistor drift layer 808 is formed in the substrate 802 under the field oxide 804 proximate to, but not directly under, the switch connection opening 806.

An n-type buried switch drift layer 810 is formed under the field oxide 804 and switch connection opening 806, for example by ion implanting n-type dopants at a dose between $6 \times 10^{11}$ atoms/cm$^2$ and $6 \times 10^{12}$ atoms/cm$^2$, followed by an anneal operation as described in reference to FIG. 7A. In one version of the instant embodiment, the switch drift layer 810 may be between 1 and 3 microns thick. A top surface of the switch drift layer 810 is at least 500 nanometers below a bottom surface of the field oxide 804. An optional p-type upper RESURF augmentation layer 812 may be formed between the field oxide 804 and the switch drift layer 810, for example by ion implanting p-type dopants such as boron through the field oxide 804. P-type material between the field oxide 804 and the switch drift layer 810, including the optional p-type upper RESURF augmentation layer 812 if formed, provides an upper RESURF layer 814 to the switch drift layer 810. A vertically cumulative doping density of the upper RESURF layer 814 is between $3 \times 10^{11}$ atoms/cm$^2$ and $3 \times 10^{12}$ atoms/cm$^2$. The switch drift layer 810 is laterally separated from the resistor drift layer 808 by a drift layer separation region 816. In one version of the instant embodiment, the resistor drift layer 808 and the switch drift layer 710 may be formed concurrently.

Referring to FIG. 8B, an n-type connecting region 818 is formed in the substrate 802 at the switch connection opening 806 extending through the upper RESURF layer 814 to the switch drift layer 810. The connecting region 818 may be formed, for example, by ion implanting n-type dopants such as phosphorus into the substrate 802 at a dose between $1 \times 10^{15}$ atoms/cm$^2$ and $3 \times 10^{16}$ atoms/cm$^2$. The connecting region 818 provides an electrical connection to the switch drift layer 810.

Referring to FIG. 8C, an n-type switch drift layer contact region 820 is formed in the switch connection opening 806 as described in reference to FIG. 7B. The connecting region 818 provides an electrical connection between the switch drift layer contact region 820 and the switch drift layer 810. Metal silicide layers, not shown, may be formed as described in reference to FIG. 7B.

Figure 9A:
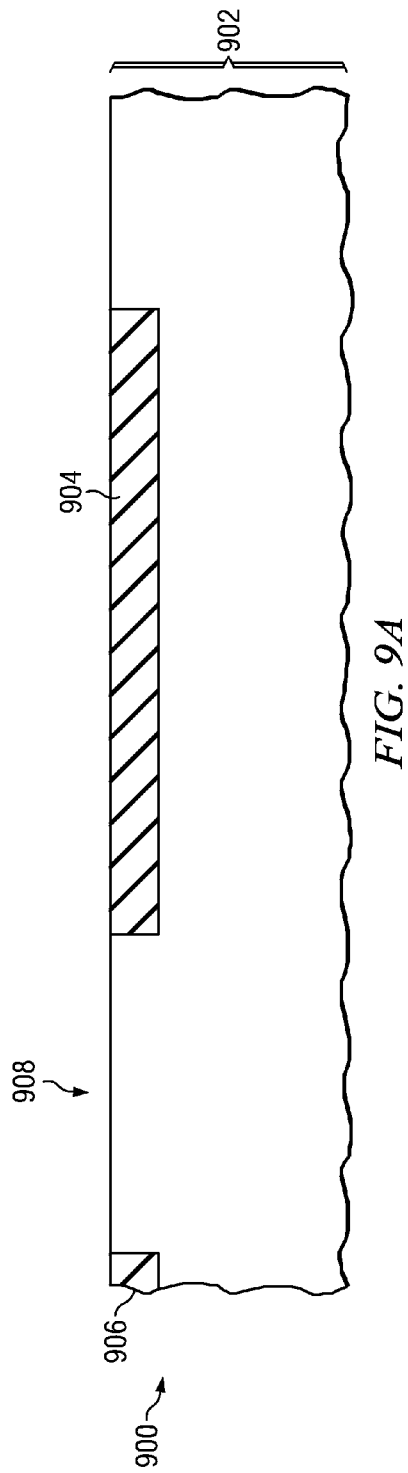
FIG. 9A through FIG. 9D are cross sections of an integrated circuit containing a gate controlled voltage divider formed according to a further embodiment, depicted in successive stages of fabrication of a switch drift layer of the gate controlled voltage divider.

FIG. 9A through FIG. 9D are cross sections of an integrated circuit containing a gate controlled voltage divider formed according to a further embodiment, depicted in successive stages of fabrication of a switch drift layer of the voltage divider. Referring to FIG. 9A, the integrated circuit 900 is formed in and on a p-type semiconductor base substrate 902, such as a single crystal silicon wafer. An n-type buried switch drift layer implanted region 904 and an n-type buried resistor drift layer implanted region 906 are formed in the base substrate 902, for example by ion implanting n-type dopants such as phosphorus at a dose between $6 \times 10^{11}$ atoms/cm$^2$ and $6 \times 10^{12}$ atoms/cm$^2$. The buried switch drift layer implanted region 904 is laterally separated from the buried resistor drift layer implanted region 906 by a drift layer separation region 908 and additional lateral space in the base substrate 902, so that a subsequently formed buried switch drift layer and buried resistor drift layer will be laterally separated by the drift layer separation region 908.

Figure 9B:
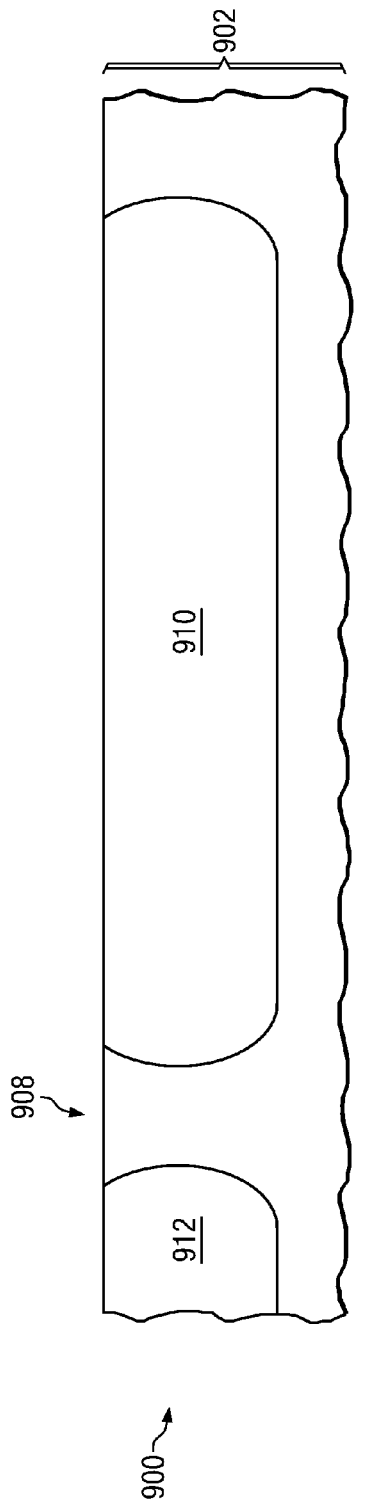

Referring to FIG. 9B, a thermal drive process is performed on the base substrate 902 which heats the base substrate 902 above 1000° C. in an anneal furnace for at least 30 minutes, causing the dopants in the buried switch drift layer implanted region 904 and the buried resistor drift layer implanted region 906 to diffuse outward and become activated, forming a buried switch drift layer 910 and a buried resistor drift layer 912 respectively. In one version of the instant embodiment, the drift layers are between 2 and 4 microns thick.

Figure 9C:
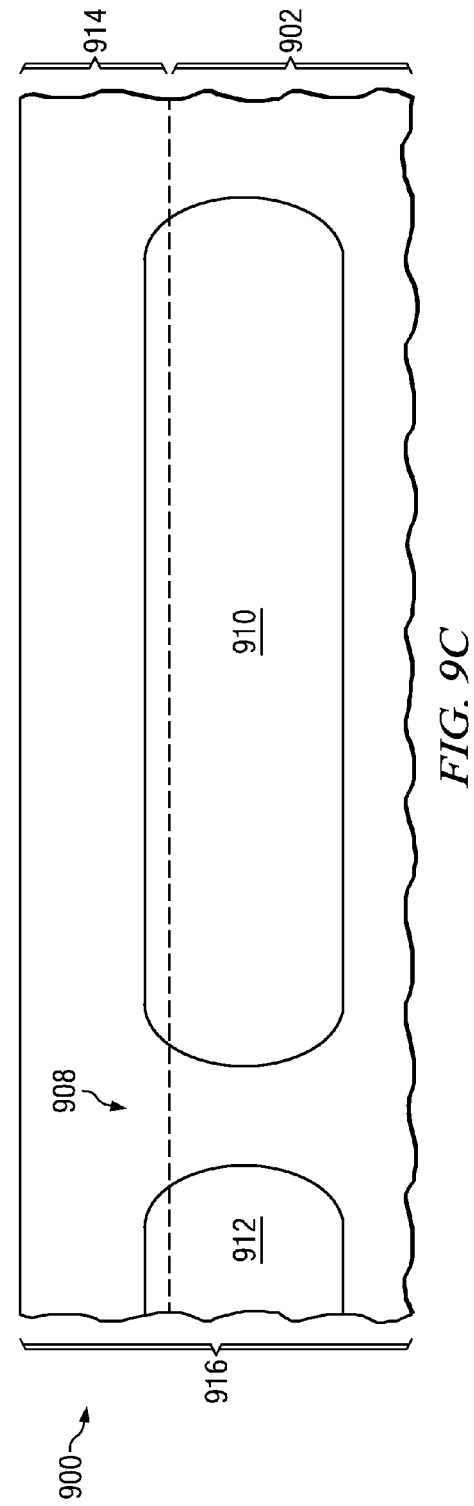

Referring to FIG. 9C, an epitaxial growth process is performed on the base substrate 902 which forms a p-type epitaxial layer 914 on the base substrate 902. In one version of the instant embodiment, the epitaxial layer 914 may be between 1 and 3 microns thick. The switch drift layer 910 and the resistor drift layer 912 may expand into the epitaxial layer 914 during the epitaxial growth process, as depicted in FIG. 9C. A combination of the base substrate 902 and epitaxial layer 914 forms a substrate 916 for the integrated circuit 900. The switch drift layer 910 and the resistor drift layer 912 may be formed concurrently with buried n-type layers of other components, not shown, in the integrated circuit 900. The switch drift layer 910 is laterally separated from the resistor drift layer 912 by the drift layer separation region 908

Figure 9D:
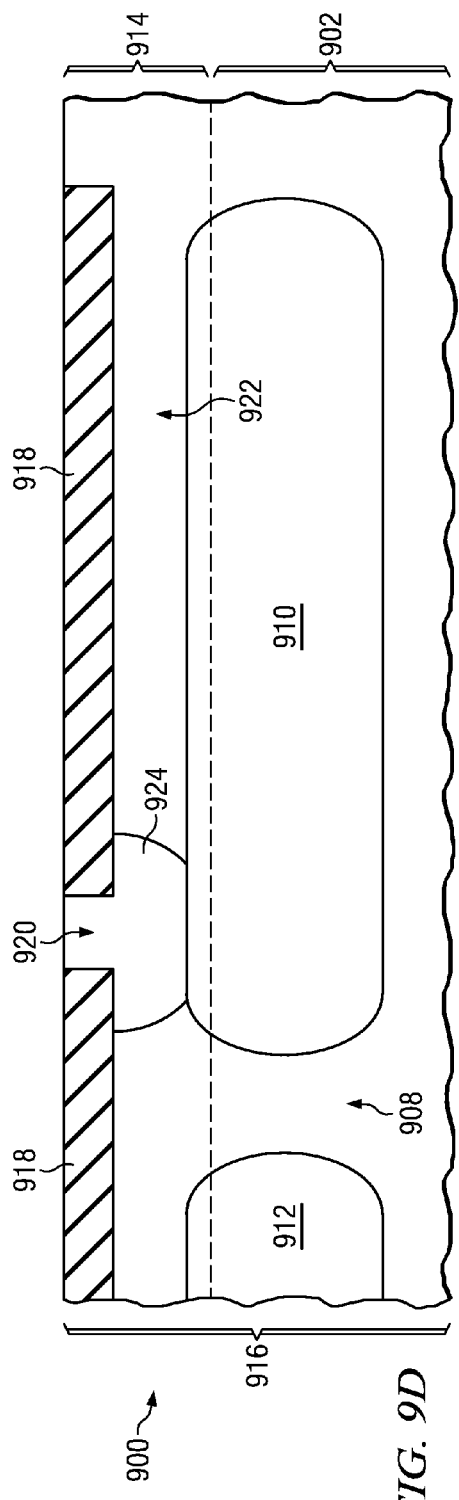

Referring to FIG. 9D, field oxide 918 with a switch connection opening 920 is formed at a top surface of the substrate 916 over the switch drift layer. A top surface of the switch drift layer 910 and the resistor drift layer 912 is at least 1 micron below a bottom surface of the field oxide 918. An optional p-type upper RESURF augmentation layer, not shown, may be formed between the field oxide 918 and the switch drift layer 910, as described in reference to FIG. 7A. P-type material between the field oxide 918 and the switch drift layer 910, including the optional p-type upper RESURF augmentation layer if formed, provides a upper RESURF layer 922. A vertically cumulative doping density of the upper RESURF layer 922 is between $3\times10^{11}$ atoms/cm$^2$ and $3\times10^{12}$ atoms/cm$^2$. An n-type connecting region 924 is formed in the substrate 916 at the switch connection opening 920 extending through the upper RESURF layer 922 to the switch drift layer 910, as described in reference to FIG. 8B. Metal silicide layers, not shown, may be formed as described in reference to FIG. 7B.

Figure 10A:
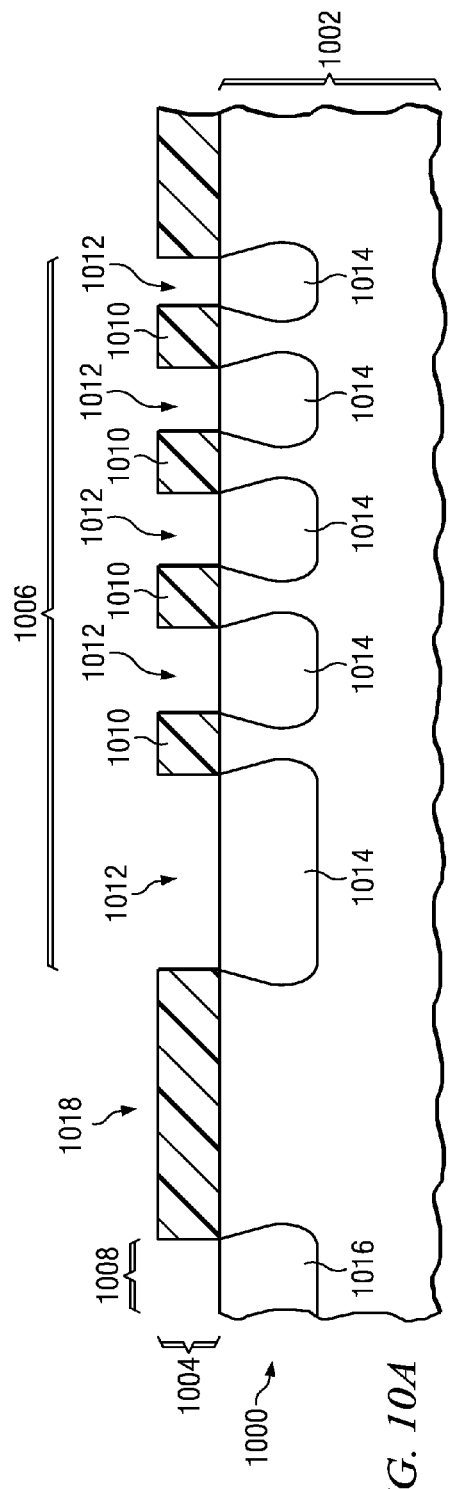

FIG. 10A through FIG. 10C are cross sections of an integrated circuit having a gate controlled voltage divider with a drift layer formed according to an embodiment, depicted in successive stages of fabrication of a switch drift layer of the voltage divider. Referring to FIG. 10A, the integrated circuit 1000 is formed in and on a p-type semiconductor base substrate 1002 as described in reference to FIG. 9A. A segmented, graded switch drift layer implant mask 1004 is formed over the base substrate 1002 so as to expose the base substrate 1002 in an area 1006 for ion implanting n-type dopants to form a segmented, graded n-type switch drift layer. The switch drift layer implant mask 1004 may also expose the base substrate 1002 in an area 1008 defined for a resistor drift layer of the voltage divider. The switch drift layer implant mask 1004 includes segmenting elements 1010 in the switch drift layer ion implant area 1006. In one version of the instant embodiment, the switch drift layer implant mask 1004 may include photoresist, for example between 0.3 and 1 micron thick. In another version, the switch drift layer implant mask 1004 may be formed of dielectric material such as silicon dioxide and/or silicon nitride by depositing one or more layers of the dielectric materials over the base substrate 1002, forming a photoresist pattern over the dielectric layers to cover areas of the switch drift layer implant mask 1004, and removing unwanted dielectric material from the dielectric layers using the photoresist pattern as an etch mask, so as to leave dielectric material under the photoresist pattern to form the switch drift layer implant mask 1004. The segmenting elements 1010 may be substantially equal in size as depicted in FIG. 10A or may be of varying size. The segmenting elements 1010 may be of any shape and/or orientation, such as radially oriented tapered trapezoids, nested arcs or round pillars. Open areas 1012 in the switch drift layer implant mask 1004 may be of sequentially increasing size as depicted in FIG. 10A, or may be substantially equal in size.

A drift layer ion implant operation is performed on the integrated circuit 1000 which implants n-type dopants such as phosphorus into the base substrate 1002 through the open areas 1012 of the drift layer implant mask 1004 to form a segmented, graded switch drift layer implanted region 1014. The term "segmented" in the description of the switch drift layer implanted region 1014 denotes that the switch drift layer implanted region 1014 is spatially segmented as a result of implanting the dopants through open areas 1012 defined by the segmenting elements 1010. The term "graded" in the description of the switch drift layer implanted region 1014 denotes that the switch drift layer implanted region 1014 has a lateral gradient in an average density of the implant dopants, resulting from the open areas 1012 sequentially increasing in size, and/or from the segmenting elements 1010 sequentially decreasing in size. In an alternate version of the instant embodiment, the switch drift layer implanted region 1014 may be segmented, but not necessarily graded, so that implanted segments of the switch drift layer implanted region 1014 are substantially equal in size and spacing. If the switch drift layer implant mask 1004 exposes the base substrate 1002 in a resistor drift layer ion implant area 1008, a resistor drift layer implanted region 1016 is formed in the base substrate 1002 by the drift layer ion implant operation. The switch drift layer implanted region 1014 is laterally separated from the resistor drift layer implanted region 1016 by a drift layer separation region 1018 and additional lateral space in the base substrate 1002, so that a subsequently formed switch drift layer and resistor drift layer will be laterally separated by the drift layer separation region 1018.

Referring to FIG. 10B, an anneal operation is performed on the base substrate 1002 which heats the base substrate 1002 above 1000° C. in an anneal furnace for at least 30 minutes, causing the dopants in the switch drift layer implanted region 1014 to diffuse outward and become activated, forming a segmented, graded switch drift layer 1020. The term "segmented" in the description of the switch drift layer 1020 denotes that the switch drift layer 1020 was formed from a segmented implanted region. The term "graded" in the description of the switch drift layer 1020 denotes that the switch drift layer 1020 has a lateral gradient in an average density of the implant dopants, resulting from formation from a graded implanted layer. In one version of the instant embodiment, the switch drift layer 1020 may be segmented but not necessarily graded. The anneal operation also causes dopants in the resistor drift layer implanted region 1016 to diffuse outward and become activated, forming a resistor drift layer 1022.

Referring to FIG. 10C, a p-type epitaxial layer 1024 is formed on the base substrate 1002, as described in reference to FIG. 9C. A combination of the base substrate 1002 and epitaxial layer 1024 forms a substrate 1026 for the integrated circuit 1000. The switch drift layer 1020 and resistor drift layer 1022 may extend into the epitaxial layer 1024 as shown in FIG. 10C. In one version of the instant embodiment, not depicted in FIG. 10C, one or more of the implanted segments of the switch drift layer implanted region 1014 may not contact other implanted segments of the switch drift layer implanted region 1014 after the epitaxial layer 1024 is formed; during operation of the integrated circuit 1000, depletion regions from the segments of the switch drift layer 1020 overlap.

Field oxide 1028 is subsequently formed over the switch drift layer 1020 at a top surface of the epitaxial layer 1024 with a switch connection opening 1030 over the switch drift layer 1020. The switch drift layer 1020 is laterally separated from the resistor drift layer 1022 by the drift layer separation region 1018.

If the switch drift layer 1020 does not extend to the bottom surface of the field oxide 1028, an n-type connecting region 1032 may be formed in the substrate 1026 at the switch connection opening 1030 extending to the switch drift layer 1020. Metal silicide layers, not shown, may be formed as described in reference to FIG. 7B.

Figure 11:
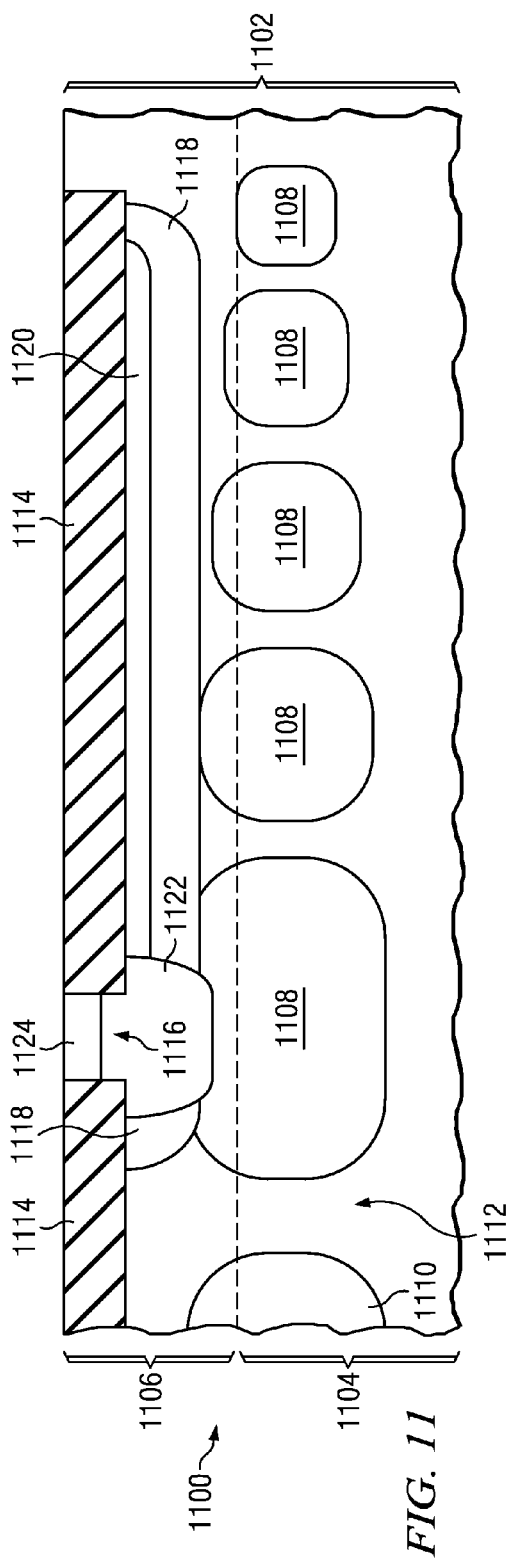
FIG. 11 is a cross section of an integrated circuit having a gate controlled voltage divider with a switch drift layer formed according to a further embodiment.

FIG. 11 is a cross section of an integrated circuit having a gate controlled voltage divider with a switch drift layer formed according to a further embodiment. The integrated circuit 1100 is formed in and on a semiconductor substrate 1102 which includes a p-type base substrate 1104 and a p-type epitaxial layer 1106. An n-type segmented, graded buried lower switch drift layer 1108 is formed in the base substrate layer 1104 and extends into the epitaxial layer 1106. In one version of the instant embodiment, the switch drift layer 1108 may include one or more disconnected segments, as depicted in FIG. 11; during operation of the integrated circuit 1100, depletion regions from the segments of the switch drift layer 1108 overlap.

A resistor drift layer 1110 is formed in the substrate 1102 laterally separated from the buried lower switch drift layer 1108 by a drift layer separation region 1112. Field oxide 1114 is formed at a top surface of the epitaxial layer 1106 over the lower switch drift layer 1108 with a switch connection opening 1116 over the lower switch drift layer 1108. An n-type upper switch drift layer 1118 is formed in the epitaxial layer 1106 so as to contact the lower switch drift layer 1108 under the switch connection opening 1116 and so as to be separated from the lower switch drift layer 1108 by a p-type region of the epitaxial layer 1106 at an outer edge of the lower switch drift layer 1108. A p-type upper RESURF layer 1120 is formed in the epitaxial layer 1106 between the field oxide 1114 and the upper switch drift layer 1118. The upper RESURF layer 1120 may be formed concurrently with p-type implants in areas defined for NMOS transistors, not shown, in the integrated circuit 1100. An n-type connecting region 1122 is formed in the epitaxial layer 1106 at the switch connection opening 1116 extending through the upper RESURF layer 1120 to the upper switch drift layer 1118 and the lower switch drift layer 1108. An n-type drift layer contact region 1124 is formed in the switch connection opening 1116, so that an electrical connection is provided from the top surface of the epitaxial layer 1106 in the switch connection opening 1116 to the upper switch drift layer 1118 and the lower switch drift layer 1108.

Figure 12:
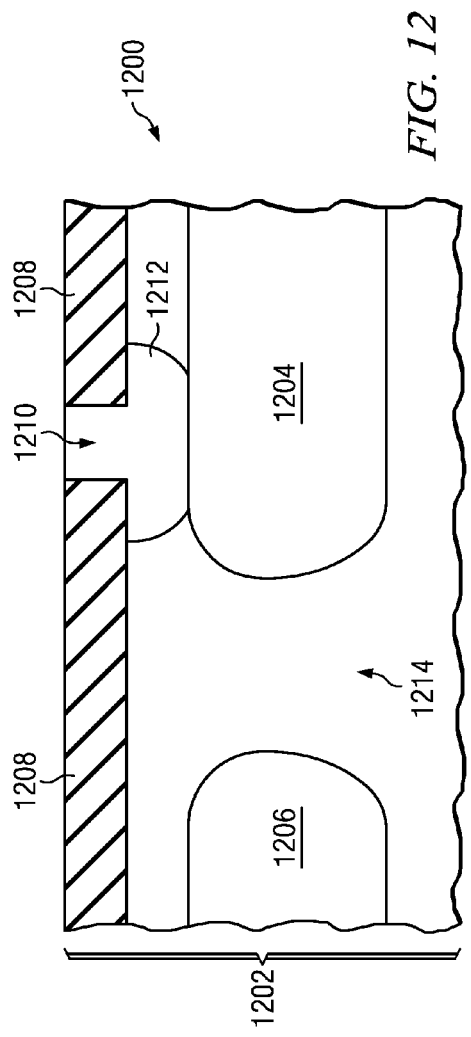
FIG. 12 through FIG. 14 are cross sections of integrated circuits having gate controlled voltage dividers with drift layer separation regions formed according to exemplary embodiments.
Figure 13:
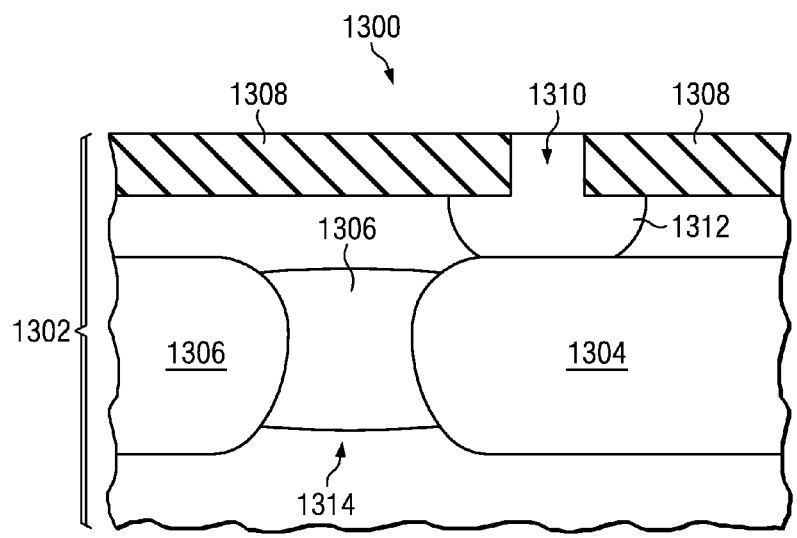
Figure 14:
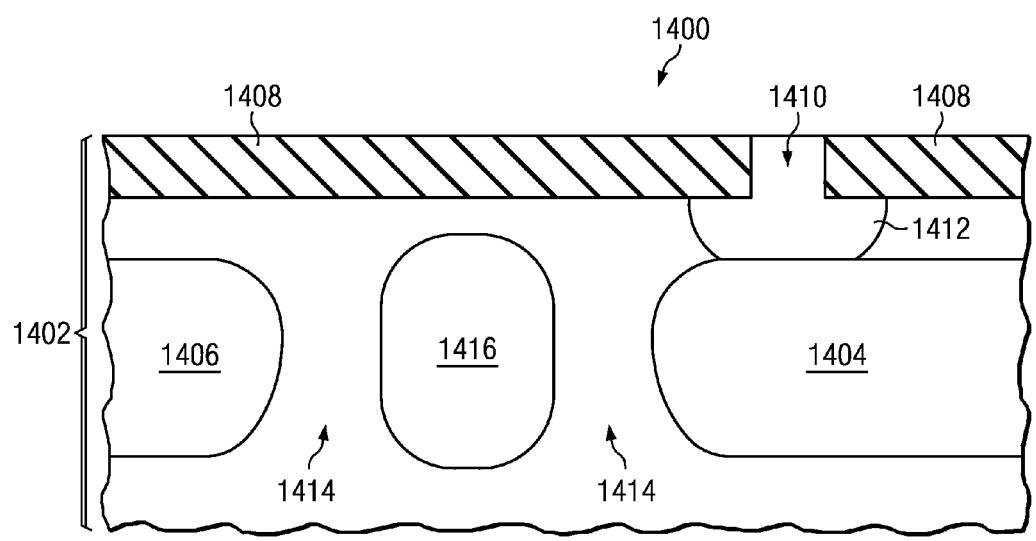

FIG. 12 through FIG. 14 are cross sections of integrated circuits having gate controlled voltage dividers with drift layer separation regions formed according to exemplary embodiments. Referring to FIG. 12, an integrated circuit 1200 is formed in an on a semiconductor substrate 1202. A switch drift layer 1204 and a resistor drift layer 1206 are formed in the substrate 1202, for example according to any of the embodiments described herein. Field oxide 1208 is formed at a top surface of the substrate 1202 with a switch connection opening 1210 over the switch drift layer 1204. A connecting region 1212 may be formed in the substrate 1202 to provide an electrical connection between the switch connection opening 1210 and the switch drift layer 1204.

The switch drift layer 1204 and the resistor drift layer 1206 are laterally separated by a drift layer separation region 1214. In the instant embodiment, the drift layer separation region 1214 has a same conductivity type as the substrate 1202 and is free of any regions with an opposite conductivity type. The drift layer separation region 1214 may be formed, for example, by blocking dopants which were ion implanted to form the switch drift layer 1204 and the resistor drift layer 1206 and other ion implanted structures, not shown, in the substrate 1202. A lateral width of the drift layer separation region 1214 is sufficient to prevent electrical breakdown between the switch drift layer 1204 and the resistor drift layer 1206 during operation of the integrated circuit 1200. For example, a drift layer separation region 1214 that is 5 microns wide in 10 ohm-cm p-type substrate material may provide adequate separation for a 700 volt input to the voltage divider during operation of the integrated circuit 1200.

Referring to FIG. 13, an integrated circuit 1300 is formed in an on a semiconductor substrate 1302. A switch drift layer 1304 and a resistor drift layer 1306 are formed in the substrate 1302, for example according to any of the embodiments described herein. Field oxide 1308 is formed at a top surface of the substrate 1302 with a switch connection opening 1310 over the switch drift layer 1304. A connecting region 1312 may be formed in the substrate 1302 to provide an electrical connection between the switch connection opening 1310 and the switch drift layer 1304.

The switch drift layer 1304 and the resistor drift layer 1306 are laterally separated by a drift layer separation region 1314. In the instant embodiment, the drift layer separation region 1314 has a same conductivity type as the substrate 1302 and is free of any regions with an opposite conductivity type. A drift layer punch through blocking layer 1316 is formed in the drift layer separation region 1314 which has the same conductivity type as the substrate 1302. The drift layer punch through blocking layer 1316 provides an average doping density between $1 \times 10^{15}$ cm$^{-3}$ and $1 \times 10^{16}$ cm$^{-3}$. The drift layer punch through blocking layer 1316 may be formed for example, by ion implanting dopants at a dose between $1 \times 10^{11}$ cm$^2$ and $1 \times 10^{12}$ $^{cm-2}$. In one version of the instant embodiment, the drift layer punch through blocking layer 1316 may be formed by implanting dopants through open areas in an implant mask so as to localize the implanted dopants in the drift layer separation region 1314. In another version, the drift layer punch through blocking layer 1316 may be formed by be performing a blanket implant across the integrated circuit 1300. A lateral width of the drift layer separation region 1314 is sufficient to prevent electrical breakdown between the switch drift layer 1304 and the resistor drift layer 1306 during operation of the integrated circuit 1300. For example, a drift layer punch through blocking layer 1316 with an average doping density between $1 \times 10^{15}$ cm$^{-3}$ and $3 \times 10^{15}$ cm$^{-3}$ that is 5 microns wide may provide adequate separation for a 700 volt input to the voltage divider during operation of the integrated circuit 1300.

Referring to FIG. 14, an integrated circuit 1400 is formed in an on a semiconductor substrate 1402. A switch drift layer 1404 and a resistor drift layer 1406 are formed in the substrate 1402, for example according to any of the embodiments described herein. Field oxide 1408 is formed at a top surface of the substrate 1402 with a switch connection opening 1410 over the switch drift layer 1404. A connecting region 1412 may be formed in the substrate 1402 to provide an electrical connection between the switch connection opening 1410 and the switch drift layer 1404.

The switch drift layer 1404 and the resistor drift layer 1406 are laterally separated by a drift layer separation region 1414.

In the instant embodiment, the drift layer separation region 1414 includes regions abutting the switch drift layer 1404 and the resistor drift layer 1406 with a same conductivity type as the substrate 1402 and a central counterdoped region 1416 with an opposite conductivity type from the substrate 1402. The central counterdoped region 1416 provides an average net doping density between $1 \times 10^{15}$ cm$^{-3}$ and $1 \times 10^{16}$ cm$^{-3}$. In one version of the instant embodiment, the central counterdoped region 1416 may be formed by ion implanting dopants at a dose between $1 \times 10^{11}$ cm$^{-2}$ and $1 \times 10^{12}$ cm$^{-2}$ through open areas in an implant mask. In another version, the central counterdoped region 1416 may be formed concurrently with the switch drift layer 1404 and the resistor drift layer 1406. A lateral width of the drift layer separation region 1414 is sufficient to prevent electrical breakdown between the switch drift layer 1404 and the resistor drift layer 1406 during operation of the integrated circuit 1400.

Figure 15:
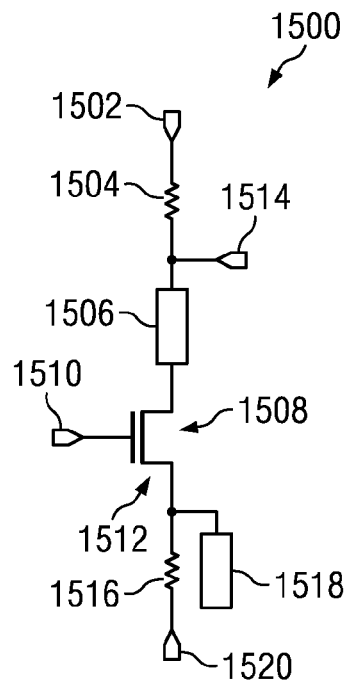
FIG. 15 is a schematic diagram of a gate controlled voltage divider according to an alternate embodiment.

FIG. 15 is a schematic diagram of a gate controlled voltage divider according to an alternate embodiment. The voltage divider 1500 includes an input terminal 1502 connected to an upper resistor 1504. The upper resistor 1504 is connected to a switch drift layer 1506 which is part of an extended drain of an MOS transistor switch 1508. The MOS transistor switch 1508 includes a gate node 1510 and a source node 1512. A sense terminal 1514 is connected to the switch drift layer 1506 and the upper resistor 1504. The source node 1512 is connected to a lower resistor 1516 and to a resistor drift layer 1518 under the lower resistor 1516. A reference node 1520 is connected to the lower resistor 1516 opposite from the source node 1512.

During operation of the voltage divider 1500, a high voltage is applied to the input terminal 1502 and a low voltage, such as Vss, is applied to the reference node 1520. In the instant embodiment, the upper resistor 1504 has a resistance significantly less than a resistance of the lower resistor 1516, so as to provide a voltage at the sense terminal 1514 within a safe operating voltage of transistors which are referenced to the input terminal 1502 in the integrated circuit containing the voltage divider 1500. In another version of the instant embodiment, the MOS transistor switch 1508 may be replaced with a JFET switch as described in reference to FIG. 3 or a bipolar transistor switch as described in reference to FIG. 5.

Figure 16:
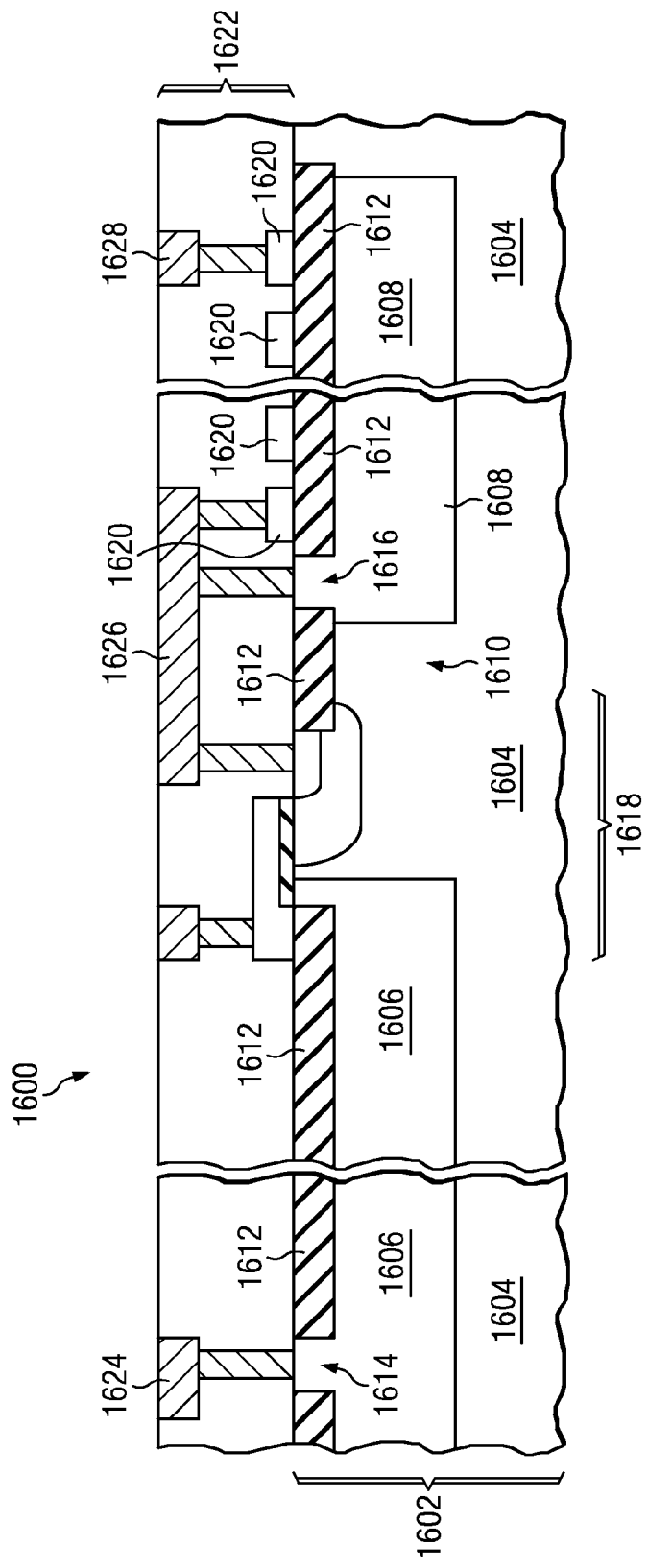
FIG. 16 is a cross section of an integrated circuit having a gate controlled voltage divider according to the embodiment described in reference to FIG. 15.

FIG. 16 is a cross section of an integrated circuit having a gate controlled voltage divider according to the embodiment described in reference to FIG. 15. The integrated circuit 1600 is formed in and on a semiconductor substrate 1602 which includes a p-type base substrate 1604, and possibly a p-type epitaxial layer, not shown. An n-type switch drift layer 1606 is formed in the substrate 1602.

A resistor drift layer 1608 is formed in the substrate 1602 laterally separated from the switch drift layer 1606 by a drift layer separation region 1610. The switch drift layer 1606 and the resistor drift layer 1608 may be formed according to any of the embodiments described herein. Field oxide 1612 is formed at a top surface of the substrate 1602 over the switch drift layer 1606 and the resistor drift layer 1608. The field oxide 1612 has a switch connection opening 1614 over the switch drift layer 1606 opposite from the resistor drift layer 1608 and a resistor drift layer opening 1616 over the resistor drift layer 1608 adjacent to the switch drift layer 1606.

A transistor switch 1618, depicted in FIG. 16 as an MOS transistor, is formed between the switch drift layer 1606 and the drift layer separation region 1610. In another version of the instant embodiment, the MOS transistor switch 1618 may be replaced with a JFET switch as described in reference to FIG. 4 or a bipolar transistor switch as described in reference to FIG. 6. A lower resistor 1620 is formed on the field oxide 1612 over the resistor drift layer 1608 according to any of the embodiments described herein.

An interconnect region 1622 is formed over the substrate 1602. A sense terminal 1624 couples an upper resistor (not shown) to the switch drift layer 1606 through the switch connection opening 1614. A switch-resistor connector 1626 couples a source node of the MOS transistor switch 1618 to the lower resistor 1620 and to the resistor drift layer 1608 through the resistor drift layer opening 1616. A reference node 1628 is coupled to the lower resistor 1620 opposite from the switch-resistor connector 1626.

Figure 17:
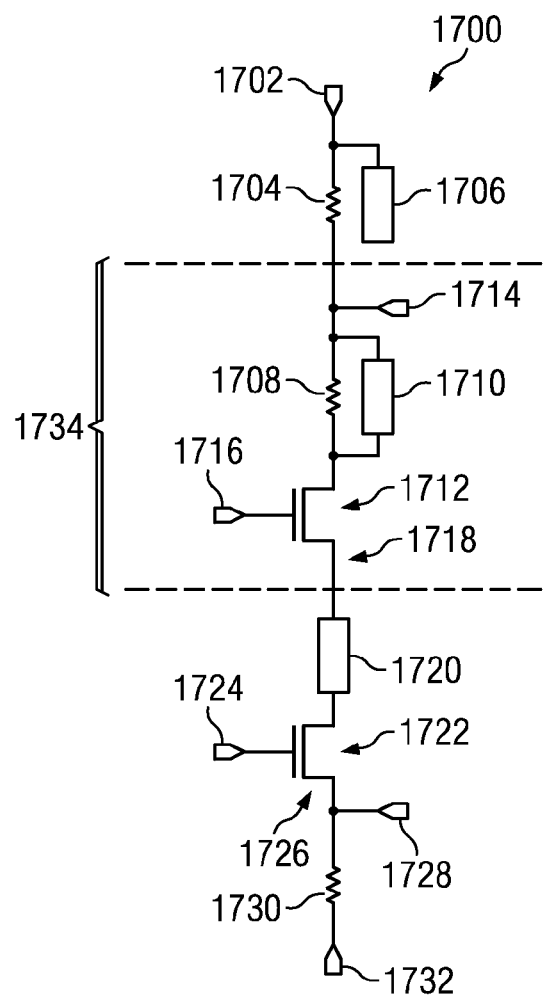
FIG. 17 is a schematic diagram of a gate controlled voltage divider according to a further embodiment.

FIG. 17 is a schematic diagram of a gate controlled voltage divider according to a further embodiment. The voltage divider 1700 includes an input terminal 1702 connected to a first upper resistor 1704. The first upper resistor 1704 is connected to a first resistor drift layer 1706 formed under the first upper resistor 1704.

The first upper resistor 1704 is connected to a second upper resistor 1708. The second upper resistor 1708 is connected to a second resistor drift layer 1710 formed under the second upper resistor 1708; the second resistor drift layer 1710 also provides a drift layer for an extended drain of a first MOS transistor switch 1712. A first sense terminal 1714 is connected to the first upper resistor 1704 and the second upper resistor 1708. The first MOS transistor switch 1712 includes a gate node 1716 and a source node 1718.

The source node 1718 of the first MOS transistor switch 1712 is connected to a switch drift layer 1720 which is part of an extended drain of a second MOS transistor switch 1722. The second MOS transistor switch 1722 includes a gate node 1724 and a source node 1726. A second sense terminal 1728 is connected to the source node 1726 of the second MOS transistor switch 1722. The source node 1726 of the second MOS transistor switch 1722 is connected to a lower resistor 1730. A reference node 1732 is connected to the lower resistor 1730 opposite from the second sense terminal 1728.

During operation of the voltage divider 1700, a high voltage is applied to the input terminal 1702 and a low voltage, such as Vss, is applied to the reference node 1732. The first sense terminal 1714 or the second sense terminal 1728 may provide a sense voltage within a safe operating voltage of transistors in the integrated circuit containing the voltage divider 1700. The first MOS transistor switch 1712 and the second MOS transistor switch 1722 may be controlled independently to reduce current through the voltage divider 1700.

In an alternate version of the instant embodiment, a resistor-switch subcircuit 1734, which includes the first sense terminal 1714, the second upper resistor 1708, the second resistor drift layer 1710 and the first MOS transistor switch 1712, may be repeated in the voltage divider 1700 to provide additional sense voltage values. In another version of the instant embodiment, the first MOS transistor switch 1712 and/or the second MOS transistor switch 1722 may be replaced with a JFET switch as described in reference to FIG. 3 or a bipolar transistor switch as described in reference to FIG. 5.

Figure 18:
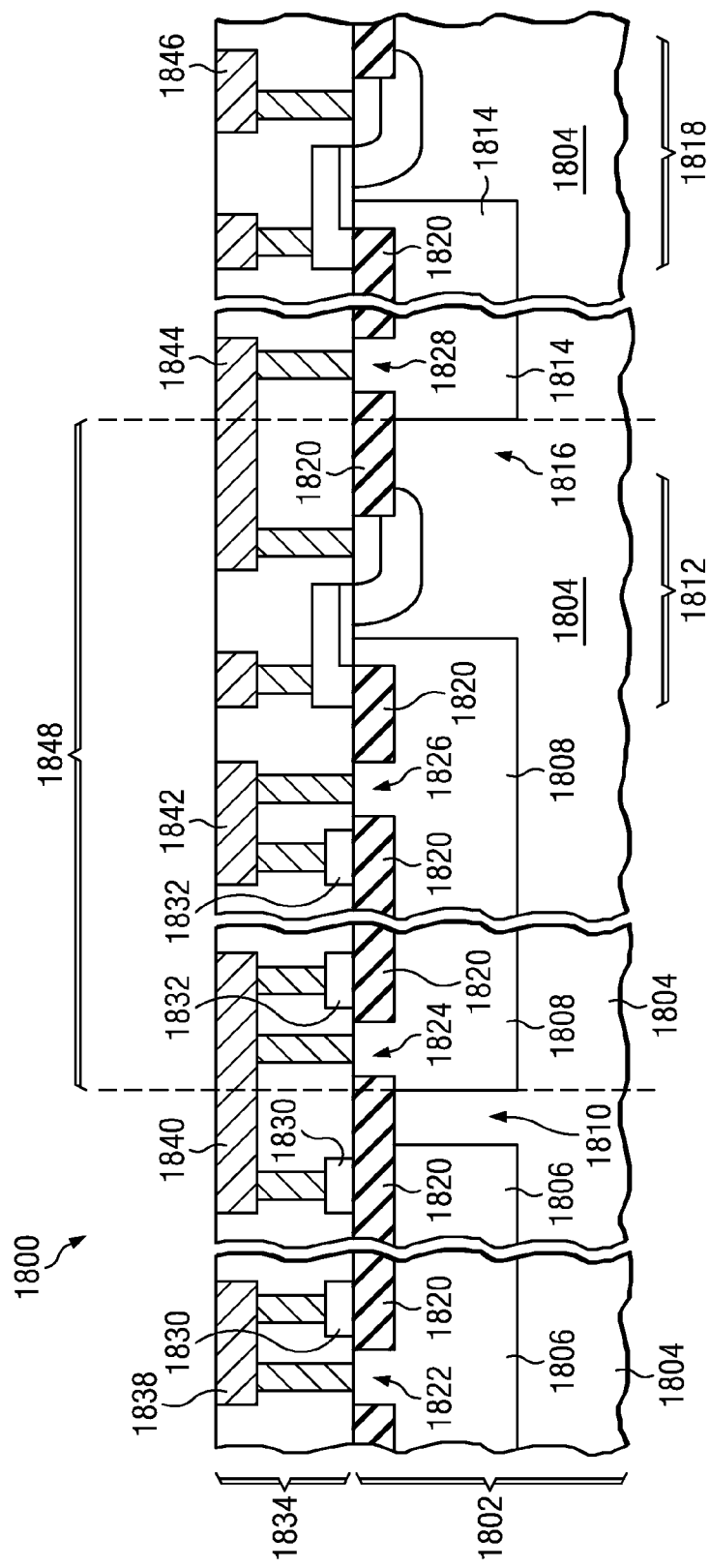
FIG. 18 is a cross section of an integrated circuit having a gate controlled voltage divider according to the embodiment described in reference to FIG. 17.

FIG. 18 is a cross section of an integrated circuit having a gate controlled voltage divider according to the embodiment described in reference to FIG. 17. The integrated circuit 1800 is formed in and on a semiconductor substrate 1802 which includes a p-type base substrate 1804, and possibly a p-type epitaxial layer, not shown. An n-type first resistor drift layer 1806 is formed in the substrate 1802. A second resistor drift layer 1808 is formed in the substrate 1802 laterally separated from the first resistor drift layer 1806 by a first drift layer separation region 1810. The second resistor drift layer 1808 also provides a drift layer for an extended drain of a first MOS transistor switch 1812. A switch drift layer 1814 is formed in the substrate 1802 laterally separated from the second resistor drift layer 1808 by a second drift layer separation region 1816. The first resistor drift layer 1806, the second resistor drift layer 1808 and the switch drift layer 1814 may be formed according to any of the embodiments described herein. The switch drift layer 1814 provides a drift layer for an extended drain of a second MOS transistor switch 1818.

Field oxide 1820 is formed at a top surface of the substrate 1802 over the first resistor drift layer 1806, the second resistor drift layer 1808 and the switch drift layer 1814. The field oxide 1820 has a first resistor drift layer opening 1822 over the first resistor drift layer 1806 opposite the second resistor drift layer 1808, a second resistor drift layer opening 1824 over the second resistor drift layer 1808 adjacent to the first resistor drift layer 1806, a first switch connection opening 1826 over the second resistor drift layer 1808 adjacent to the first MOS transistor switch 1812, and a second switch connection opening 1828 over the switch drift layer 1814 opposite the second MOS transistor switch 1818. In another version of the instant embodiment, the first MOS transistor switch 1812 and/or the second MOS transistor switch 1818 may be replaced with a JFET switch as described in reference to FIG. 4 or a bipolar transistor switch as described in reference to FIG. 6. A first upper resistor 1830 is formed on the field oxide 1820 over the first resistor drift layer 1806, and a second upper resistor 1832 is formed on the field oxide 1820 over the second resistor drift layer 1808, according to any of the embodiments described herein.

An interconnect region 1834 is formed over the substrate 1802. An input terminal 1838 is coupled to the first upper resistor 1830 and to the first resistor drift layer 1806 through the first resistor drift layer opening 1822. A first sense terminal 1840 couples the first upper resistor 1830 to the second upper resistor 1832 and to the second resistor drift layer 1808 through the second resistor drift layer opening 1824. A first switch resistor connector 1842 couples the second upper resistor 1832 to the second resistor drift layer 1808 through the first switch connection opening 1826. A second switch resistor connector 1844 couples a source node of the first MOS transistor switch 1812 to the switch drift layer 1814 through the second switch connection opening 1828. A second sense terminal 1846 is coupled to a source node of the second MOS transistor switch 1818.

In an alternate version of the instant embodiment, a resistor-switch subcircuit 1848, which includes the first sense terminal 1840, the second upper resistor 1832, the second resistor drift layer 1808, the first MOS transistor switch 1812 and the second drift layer separation region 1816, may be repeated in the voltage divider to provide additional sense voltage values.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a substrate comprising a semiconductor having a first conductivity type;
   field oxide formed at a top surface of said substrate; and
   a gate controlled voltage divider, including:
      a first resistor located over said field oxide;
      a resistor drift layer located in said substrate under said first resistor, said resistor drift layer being electrically connected to said first resistor, and said resistor drift layer having a second conductivity type opposite from said first conductivity type;
      a second resistor; and
      a transistor switch including a switch drift layer, wherein:
         said switch drift layer is located in said substrate and has said second conductivity type;
         said switch drift layer is electrically coupled to one of said first resistor and said second resistor; and
         said switch drift layer is laterally separated from said resistor drift layer by a drift layer separation region of said first conductivity type.

2. The integrated circuit of claim 1, in which:
   said transistor switch is a metal oxide semiconductor (MOS) transistor; and
   said switch drift layer is part of an extended drain of said MOS transistor.

3. The integrated circuit of claim 1, in which:
   said transistor switch is a junction field effect transistor (JFET); and
   said switch drift layer is part of an extended drain of said JFET.

4. The integrated circuit of claim 1, in which:
   said transistor switch is a bipolar transistor; and
   said switch drift layer is part of an extended collector of said bipolar transistor.

5. The integrated circuit of claim 1, in which a vertical distribution of dopants in said switch drift layer is substantially equal to a vertical distribution of dopants in said resistor drift layer.

6. The integrated circuit of claim 1, in which said switch drift layer contacts a bottom surface of said field oxide and extends to a depth between 1 and 3 microns.

7. The integrated circuit of claim 1, in which said switch drift layer is graded and segmented.

8. The integrated circuit of claim 1, in which:
   said drift layer separation region is free of any regions with a conductivity type opposite from said substrate; and
   said drift layer separation region includes a drift layer punch through blocking layer which provides an average doping density between $1 \times 10^{15}$ cm$^{-3}$ and $1 \times 10^{16}$ cm$^{-3}$.

9. An integrated circuit, comprising:
   a substrate comprising a semiconductor having a first conductivity type;
   field oxide formed at a top surface of said substrate; and
   a gate controlled voltage divider, including:
   a first resistor located over said field oxide;
   a resistor drift layer located in said substrate under said first resistor, said resistor drift layer being electrically connected to said first resistor, and said resistor drift layer having a second conductivity type opposite from said first conductivity type;
   a second resistor; and
   a transistor switch including a switch drift layer, wherein:
   said switch drift layer is located in said substrate and has said second conductivity type;
   said switch drift layer is electrically coupled to one of said first resistor and said second resistor; and
   said switch drift layer is laterally separated from said resistor drift layer by a drift layer separation region of said first conductivity type; in which:

a top surface of said switch drift layer is at least 500 nanometers below a bottom surface of said field oxide; and semiconductor material with an opposite conductivity type from said switch drift layer between said field oxide and said switch drift layer provides an upper RESURF layer to said switch drift layer, said upper RESURF layer having vertically cumulative doping density between $3 \times 10^{11}$ atoms/cm$^2$ and $3 \times 10^{12}$ atoms/cm$^2$.

10. An integrated circuit, comprising:

a substrate comprising a semiconductor having a first conductivity type;

field oxide formed at a top surface of said substrate; and a gate controlled voltage divider, including:

a first resistor located over said field oxide;

a resistor drift layer located in said substrate under said first resistor, said resistor drift layer being electrically connected to said first resistor, and said resistor drift layer having a second conductivity type opposite from said first conductivity type;

a second resistor; and a transistor switch including a switch drift layer, wherein:

said switch drift layer is located in said substrate and has said second conductivity type;

said switch drift layer is electrically coupled to one of said first resistor and said second resistor; and said switch drift layer is laterally separated from said resistor drift layer by a drift layer separation region of said first conductivity type; in which:

said drift layer separation region includes regions abutting said switch drift layer and said resistor drift layer with a same conductivity type as said substrate; and said drift layer separation region includes a central counterdoped region with said second conductivity type, said central counterdoped region providing an average net doping density between $1 \times 10^{15}$ cm$^{-3}$ and $1 \times 10^{16}$ cm$^{-3}$.

11. An integrated circuit, comprising:

a substrate comprising a semiconductor having a first conductivity type;

field oxide formed at a top surface of said substrate; and a gate controlled voltage divider, including:

a first resistor located over said field oxide, wherein the first resistor is a spiral resistor encircling a central opening and having a central opening end at the central opening;

a resistor drift layer located in said substrate under said first resistor, said resistor drift layer being electrically connected to the central opening end of said first resistor through the central opening, and said resistor drift layer having a second conductivity type opposite from said first conductivity type;

an input terminal connected to the resistor drift layer at the central opening and coupled to the central opening end of the first resistor;

a second resistor;

a transistor switch including a switch drift layer, wherein:

said switch drift layer is located in said substrate and has said second conductivity type;

said switch drift layer is electrically coupled to an outermost end of said first resistor, wherein the outermost end is opposite the central opening end; and said switch drift layer is laterally separated from said resistor drift layer by a drift layer separation region of said first conductivity type; and a source terminal coupled to the transistor and the second resistor.

12. A process of forming an integrated circuit containing a gate controlled voltage divider, comprising steps:

providing a substrate comprising a semiconductor having a first conductivity type;

forming field oxide at a surface of said substrate;

forming a resistor drift layer in said substrate under said field oxide, said resistor drift layer having a second conductivity type opposite from said first conductivity type;

forming a transistor switch including a step of forming a switch drift layer in said substrate under said field oxide, said switch drift layer having said second conductivity type, so that said switch drift layer is laterally separated from said resistor drift layer by a drift layer separation region located in said substrate, said drift layer separation region having said first conductivity type;

forming an first resistor located over said field oxide and said resistor drift layer;

forming a second resistor;

forming an electrical coupling between said first resistor and said resistor drift layer; and forming an electrical coupling between said first resistor and said switch drift layer.

13. The process of claim 12, in which:

said transistor switch is a metal oxide semiconductor (MOS) transistor; and said switch drift layer is part of an extended drain of said MOS transistor.

14. The process of claim 12, in which:

said transistor switch is a JFET; and said switch drift layer is part of an extended drain of said JFET.

15. The process of claim 12, in which:

said transistor switch is a bipolar transistor; and said switch drift layer is part of an extended collector of said bipolar transistor.

16. The process of claim 12, in which a vertical distribution of dopants in said switch drift layer is substantially equal to a vertical distribution of dopants in said resistor drift layer.

17. The process of claim 12, in which said switch drift layer contacts a bottom surface of said field oxide and extends to a depth between 1 and 3 microns.

18. The process of claim 12, in which:

a top surface of said switch drift layer is at least 500 nanometers below a bottom surface of said field oxide; and semiconductor material with an opposite conductivity type from said switch drift layer between said field oxide and said switch drift layer provides an upper RESURF layer to said switch drift layer, said upper RESURF layer having vertically cumulative doping density between $3 \times 10^{11}$ atoms/cm$^2$ and $3 \times 10^{12}$ atoms/cm$^2$.

19. The process of claim 12, in which said switch drift layer is graded and segmented.

20. The process of claim 12, in which:

said drift layer separation region is free of any regions with a conductivity type opposite from said substrate; and said drift layer separation region includes a drift layer punch through blocking layer which provides an average doping density between $1 \times 10^{15}$ cm$^{-3}$ and $1 \times 10^{16}$ cm$^{-3}$.

21. The process of claim 12, in which:

said drift layer separation region includes regions abutting said switch drift layer and said resistor drift layer with a same conductivity type as said substrate; and said drift layer separation region includes a central counterdoped region with said second conductivity type, said central counterdoped region providing an average net doping density between $1\times10^{15}$ cm$^{-3}$ and $1\times10^{16}$ cm$^{-3}$.

* * * * *